(12) United States Patent
Olson et al.

(10) Patent No.: US 12,362,322 B2
(45) Date of Patent: Jul. 15, 2025

(54) METHOD OF MAKING A FAN-OUT SEMICONDUCTOR ASSEMBLY WITH AN INTERMEDIATE CARRIER

(71) Applicant: Deca Technologies USA, Inc., Tempe, AZ (US)

(72) Inventors: Timothy L. Olson, Phoenix, AZ (US); Paul R. Hoffman, San Diego, CA (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 18/748,007

(22) Filed: Jun. 19, 2024

(65) Prior Publication Data

US 2024/0429201 A1  Dec. 26, 2024

Related U.S. Application Data

(60) Provisional application No. 63/522,705, filed on Jun. 22, 2023.

(51) Int. Cl.
  *H01L 25/065* (2023.01)
  *H01L 23/00* (2006.01)
  (Continued)

(52) U.S. Cl.
  CPC .... *H01L 25/0652* (2013.01); *H01L 23/49816* (2013.01); *H01L 23/49822* (2013.01); *H01L 23/5381* (2013.01); *H01L 24/05* (2013.01); *H01L 24/13* (2013.01); *H01L 24/97* (2013.01); *H01L 2224/05008* (2013.01); *H01L 2224/05024* (2013.01); *H01L 2224/13008* (2013.01); *H01L 2224/13025* (2013.01);
  (Continued)

(58) Field of Classification Search
  CPC .............. H01L 21/78–86; H01L 21/77; H01L 25/0655; H01L 25/072; H01L 25/165; H01L 25/50; H01L 23/28–3128; H01L 24/97; H01L 2224/97; H01L 2221/68304–68377
  See application file for complete search history.

(56) References Cited

U.S. PATENT DOCUMENTS

| | | | |
|---|---|---|---|
| 5,359,496 A | 10/1994 | Kornrumpf | |
| 5,465,217 A | 11/1995 | Yip | |

(Continued)

FOREIGN PATENT DOCUMENTS

| | | | | |
|---|---|---|---|---|
| CN | 104733379 A | * | 6/2015 | ......... H01L 21/6835 |
| JP | H0992982 | | 4/1997 | |

(Continued)

*Primary Examiner* — Evan G Clinton
(74) *Attorney, Agent, or Firm* — Booth Udall, PLC; Kenneth C. Booth

(57) ABSTRACT

A method of making a semiconductor assembly may include providing a plurality of components, providing a one or more intermediate carriers, and mounting the plurality of components to the one or more intermediate carriers. The method may further include providing a temporary carrier, mounting the one or more intermediate carriers to the temporary carrier, and disposing an encapsulant over the one or more intermediate carriers and over the plurality of components mounted to the temporary carrier to form a reconstituted panel. The encapsulant may be disposed around four side surfaces of each of the plurality of components.

21 Claims, 27 Drawing Sheets

(51) Int. Cl.
*H01L 23/498* (2006.01)
*H01L 23/538* (2006.01)

(52) U.S. Cl.
CPC .............................. *H01L 2224/97* (2013.01);
*H01L 2924/01029* (2013.01); *H01L 2924/1203*
(2013.01); *H01L 2924/1431* (2013.01); *H01L*
*2924/1434* (2013.01); *H01L 2924/15311*
(2013.01)

(56) References Cited

U.S. PATENT DOCUMENTS

| | | | |
|---|---|---|---|
| 5,741,727 | A | 4/1998 | Wang |
| 6,249,047 | B1 | 6/2001 | Corisis |
| 6,392,301 | B1 | 5/2002 | Waizman |
| 6,433,419 | B2 | 8/2002 | Khandros |
| 6,655,011 | B1 | 12/2003 | Kornrumpf |
| 6,836,023 | B2 | 12/2004 | Joshi |
| 6,851,100 | B1 | 2/2005 | You |
| 7,078,272 | B2 | 7/2006 | Ho |
| 7,296,103 | B1 | 11/2007 | Purdy |
| 7,659,622 | B2 | 2/2010 | Dauksher |
| 7,725,862 | B2 | 5/2010 | Hummler |
| 7,772,696 | B2 | 8/2010 | Hunter |
| 7,928,563 | B2 | 4/2011 | Bakir |
| 7,979,813 | B2 | 7/2011 | Rumsey |
| 8,004,095 | B2 | 8/2011 | Shim |
| 8,053,279 | B2 | 11/2011 | Farnworth |
| 8,084,871 | B2 | 12/2011 | Rahim |
| 2001/0020735 | A1 | 9/2001 | Chikawa |
| 2003/0066040 | A1 | 4/2003 | Morgan |
| 2003/0090006 | A1 | 5/2003 | Farnworth |
| 2003/0124868 | A1 | 7/2003 | Mizukoshi |
| 2004/0032013 | A1 | 2/2004 | Cobbley |
| 2004/0049912 | A1 | 3/2004 | Akagawa |
| 2004/0227897 | A1 | 11/2004 | Wu |
| 2005/0248022 | A1 | 11/2005 | Badr |
| 2006/0168552 | A1 | 7/2006 | Farnworth |
| 2007/0249067 | A1 | 10/2007 | Hedler |
| 2008/0136004 | A1 | 6/2008 | Yang |
| 2008/0178127 | A1 | 7/2008 | Dewkett |
| 2008/0230889 | A1 | 9/2008 | Standing |
| 2008/0237828 | A1 | 10/2008 | Yang |
| 2008/0288908 | A1 | 11/2008 | Hart |
| 2009/0057888 | A1 | 3/2009 | Hunter |
| 2010/0039016 | A1 | 2/2010 | Lhee |
| 2010/0100356 | A1 | 4/2010 | Tsutsui |
| 2010/0180249 | A1 | 7/2010 | Rumsey |
| 2010/0203676 | A1 | 8/2010 | Theuss |
| 2010/0230795 | A1 | 9/2010 | Kriman |
| 2010/0301474 | A1 | 12/2010 | Yang |
| 2011/0074041 | A1 | 3/2011 | Leung |
| 2011/0108981 | A1 | 5/2011 | Rahim |
| 2011/0154277 | A1 | 6/2011 | Ankenbauer |
| 2011/0202896 | A1 | 8/2011 | Scanlan |
| 2016/0163578 | A1 | 6/2016 | Yu |
| 2016/0163680 | A1 | 6/2016 | Lin |
| 2017/0256468 | A1 | 9/2017 | Viraraghavan |
| 2018/0019166 | A1 | 1/2018 | Cheng |
| 2019/0244907 | A1 * | 8/2019 | Liao .................... H01L 23/5389 |
| 2020/0075510 | A1 | 3/2020 | Chang Chien |
| 2020/0075569 | A1 * | 3/2020 | Jeng ........................ H01L 24/09 |
| 2021/0159165 | A1 | 5/2021 | Ahn |
| 2022/0068887 | A1 * | 3/2022 | Chung .................... H01L 25/50 |
| 2022/0208708 | A1 | 6/2022 | Li |

FOREIGN PATENT DOCUMENTS

| | | |
|---|---|---|
| JP | 2023056529 | 4/2023 |
| KR | 20100021131 | 2/2010 |
| KR | 1020120109410 | 10/2012 |
| KR | 1020170106633 | 9/2017 |
| TW | 201714234 A * | 4/2017 |
| TW | 202010024 | 3/2020 |
| TW | 202131472 | 8/2021 |
| TW | 202238759 | 10/2022 |

* cited by examiner

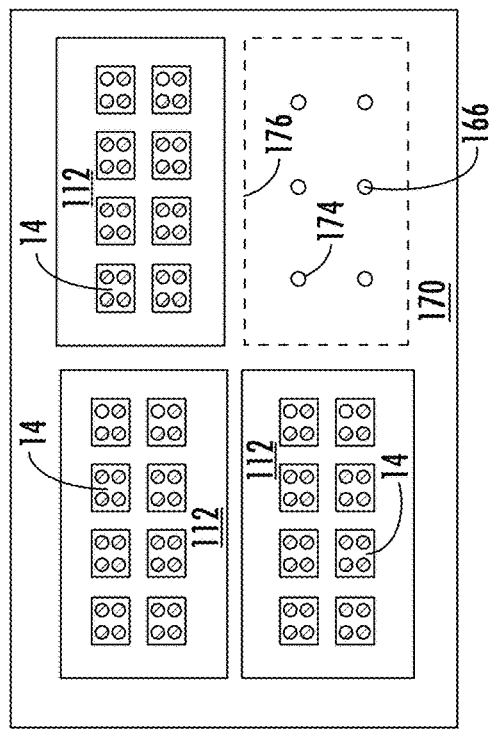
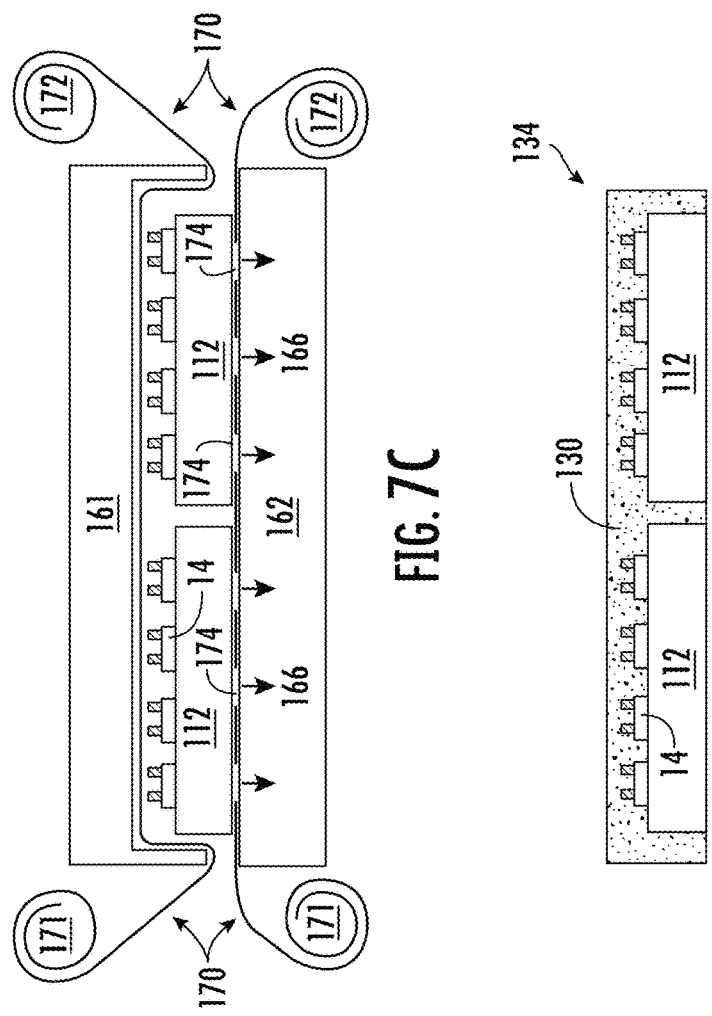
FIG. 7D
FIG. 7C
FIG. 7E

METHOD OF MAKING A FAN-OUT SEMICONDUCTOR ASSEMBLY WITH AN INTERMEDIATE CARRIER

CROSS REFERENCE TO RELATED APPLICATIONS

This application claims the benefit of U.S. provisional patent application No. 63/522,705, filed Jun. 22, 2023 titled "Method of Making a Fan-Out Semiconductor Assembly with an Intermediate Carrier," the entirety of the disclosure of which is hereby incorporated by this reference.

INCORPORATION BY REFERENCE

This disclosure hereby incorporates by reference the entirety of the disclosures of: (i) U.S. patent application Ser. No. 13/891,006, titled "Semiconductor Device and Method of Adaptive Patterning for Panelized Packaging," filed May 9, 2013, and issued as U.S. Pat. No. 9,196,509; (ii) U.S. patent application Ser. No. 13/893,117, titled "Adaptive Patterning for Panelized Packaging," filed May 13, 2013, and issued as U.S. Pat. No. 8,826,221; and (iii) U.S. patent application Ser. No. 17/939,833, titled "Method for Redistribution Layer (RDL) Repair by Mitigating At Least One Defect With a Custom RDL," filed Sep. 7, 2022, and issued as U.S. Pat. No. 11,887,862.

TECHNICAL FIELD

Embodiments of the present disclosure relate to the field of devices and methods of forming an electronic assembly or semiconductor assembly using an intermediate carrier disposed on a larger carrier, such as to produce fan-out and fan-in assembly structures.

BACKGROUND

Semiconductor packages and assemblies comprise chips or die mounted to substrates. Die attach machines take chips from singulated wafers, including native wafers, and place them on substrates, leadframes, or printed circuit boards (PCBs) for subsequent packaging and interconnection. Die attach machines provide for a number of benefits in chip placement including: (i) High Precision Placement, (ii) High Throughput, (iii) Bonding Techniques, (iv) Advanced Dispensing Systems, (v) Multi-Die and Multi-Substrate Handling, (vi) Thermal Management, (vii) Process Monitoring and Control, (viii) Flexibility and Adaptability, and (ix) Automation and Integration. Die attach machines facilitate a convergence of precision engineering, advanced vision systems, and sophisticated process control technologies to achieve high accuracy and speeds of die placement on the order of up to 500 die per minute.

Similarly, pick and place machines, also known as placement machines, are automated systems widely used in electronics manufacturing for accurately placing components onto PCBs or other substrates. Pick and place machines are used in the surface mount technology (SMT) assembly process to facilitate the rapid and precise placement of a diverse range of electronic components, including packaged integrated circuits (ICs), resistors, capacitors, and other surface-mount devices (SMDs). Pick and place machines encompasses several technologies and methodologies designed to enhance placement accuracy, speed, flexibility, and reliability, and can place on the order of 120,000 components per hour. Pick and place machines features include: (i) Vision Systems, (ii) High-Speed and Multi-Head Placement, (iii) Component Feeders, (iv) Precision Motion Control, (v) Smart Software and Data Integration, (vi) Adaptive and Flexible Placement, (vii) Automated Changeover and Setup, (viii) Advanced Error Detection and Correction, and (ix) Environmental Control, each of which is discussed briefly below.

There are also what might be termed hybrid placement machines that are capable of placing chips from a diced wafer as well as SMD components or packaged ICs.

SUMMARY

An opportunity exists for improved semiconductor assemblies, including applications for semiconductor manufacturing. Accordingly, in some embodiment, the disclosure may comprise a method of making an electronic assembly comprising providing a plurality of components comprising conductive studs disposed over a front surface of the plurality of components. The plurality of components $C_1$ may comprise a thickness in a range of 2-500 micrometers (μm). One or more intermediate carriers may be provided, wherein the one or more intermediate carriers are not interposers and do not comprise electrical routing. The plurality of components may be mounted to the one or more intermediate carriers. A temporary carrier may be provided. The one or more intermediate carriers may be mounted to the temporary carrier, wherein the one or more intermediate carriers comprise the plurality of components mounted to the one or more intermediate carriers. An encapsulant may be disposed over the one or more intermediate carriers and over the plurality of components mounted to the one or more intermediate carriers after the intermediate carriers are mounted to the temporary carrier so as to form a reconstituted panel. The encapsulant may be disposed around four side surfaces of each of the plurality of components, over the front surface of each of the plurality of components, and contacting at least a portion of the sides of the conductive studs. A portion of the encapsulant may be removed to form a substantially planar surface above the front surface of the plurality of components, wherein the substantially planar surface comprises ends of the conductive studs and a planar surface of the encapsulant.

In some aspects, the method of making an electronic assembly may comprise the plurality of components comprising one or more of: an active device, a passive device, an IPD, a MEMS device, a sensor, a semiconductor chip, a transistor, a diode, a chiplet, an LED, a VCSEL, an RF device, a microwave device, a photonic device, and a bridge die, which comprise a footprint with edge lengths in a range of 0.15-25.0 millimeters (mm), or more. The one or more intermediate carriers may comprise one or more of a core, a copper-clad laminate, a sheet of woven glass fiber impregnated with epoxy, FR4, Composite Epoxy Material (CEM), a printed circuit board (PCB) core, plastic, mold compound, a PCB with routing, glass, metal, ceramic, silicon, fiberboard, a laminate of paper and epoxy or phenolic resin, and polymer. The thickness C1 of the plurality of components may be within a range of 2-125 μm. The temporary carrier may be removed after disposing an encapsulant over the one or more intermediate carriers; and a warpage compensation material may be applied to a backside of the intermediate carriers after removing the temporary carrier from the reconstituted panel comprising intermediate carriers. A fan-in or fan-out build-up interconnect structure may be applied over the substantially planar surface above each of the plurality of components that extends beyond an edge of each of the plurality of components. The temporary carrier may be removed after disposing an encapsulant over the one or more intermediate carriers; and the intermediate carriers and at least a portion of the encapsulant may be removed through a grinding process to thin the reconstituted panel and expose backsides of the plurality of components. The temporary carrier may be removed after disposing an encapsulant over the one or more intermediate carriers; and the one or more intermediate carriers may be left within the reconstituted panel. The one or more intermediate carriers may comprise a conductive material that provides electrical conductivity, thermal conductivity, or both, to backsides of the plurality of components.

In some embodiments, the disclosure may comprise a method of making an electronic assembly comprising providing a plurality of components; providing a one or more intermediate carriers; mounting the plurality of components to the one or more intermediate carriers; providing a temporary carrier; mounting the one or more intermediate carriers to the temporary carrier; and disposing an encapsulant over the one or more intermediate carriers and over the plurality of components mounted to the temporary carrier to form a reconstituted panel. The one or more intermediate carriers may comprise the plurality of components already mounted to the one or more intermediate carriers before the one or more intermediate carriers are mounted to the temporary carrier. The encapsulant may be disposed around four side surfaces of each of the plurality of components.

In some aspects, the method of making an electronic assembly may comprise forming the plurality of components with contact pads disposed on a front surface of the plurality of components and without conductive studs. The plurality of components may be coupled to the one or more intermediate carriers with a first release layer; and the intermediate carriers may be coupled to the temporary carrier with a second release layer, wherein the first release layer and the second release layer comprise one or more of: a UV release layer with a translucent carrier, a thermal release layer, and a first thermal release layer that releases at a first temperature, and a second thermal release layer that releases at a second temperature that is greater than the first temperature. The plurality of components may be provided comprising conductive studs disposed over a front surface of the plurality of components. The plurality of components may be disposed face-up over the intermediate carrier and over the temporary carrier. A portion of the encapsulant may be removed to form a substantially planar surface above the front surface of the plurality of components, wherein the substantially planar surface comprises ends of the conductive studs and a planar surface of the encapsulant. The intermediate carrier may be removed from the plurality of components either before or after disposing the encapsulant around the plurality of components and around the one or more intermediate carriers. The plurality of components may comprise one or more of: an active device, a passive device, a MEMS device, a sensor, a semiconductor chip, a chiplet, an LED, a VCSEL, an RF device, and a bridge die. The plurality of components may comprise a footprint with edge lengths in a range of 0.15-25 millimeters (mm) or 0.15-3.0 mm, and a thickness, $C_1$, in a range of 2-780 micrometers (µm). A fan-out build-up interconnect structure 154, 155 may be formed over each of the plurality of components that extends beyond an edge of each of the plurality of components. In some cases, a fan-in interconnect structure may be formed over each of the plurality of components that does not extend beyond an edge of each of the plurality of components. In some cases, the interconnect structure may comprise a mix of fan-in and fan-out structures. The temporary carrier may be removed after disposing an encapsulant material over the one or more intermediate carriers; and a portion of the encapsulant may be removed through a grinding process to thin the reconstituted panel and to remove at least a portion of the intermediate carriers. For simplicity and ease of description, the term "fan-out" is used herein with respect to build-up interconnects structures 154, 155, but the POSA will appreciate that build-up interconnects structures 154, 155 comprise both fan-in and fan-out structures, as well as mix of the same.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that they can be their own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

BRIEF DESCRIPTION OF THE DRAWINGS

Implementations will hereinafter be described in conjunction with the appended and/or included drawings, where like designations denote like elements, and:

FIGS. 7A-7E illustrate methods of encapsulating intermediate carriers.

DETAILED DESCRIPTION

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the figures are illustrative representations and are not necessarily drawn to scale.

This disclosure, its aspects, and implementations, are not limited to the specific package types, material types, or other system component examples, or methods disclosed herein. Many additional components, manufacturing and assembly procedures known in the art consistent with semiconductor wafer fabrication, manufacture and packaging are contemplated for use with particular implementations from this disclosure. Accordingly, for example, although particular implementations are disclosed, such implementations and implementing components may comprise any components, models, types, materials, versions, quantities, or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented but have been omitted for purposes of brevity.

The foregoing and other aspects, features, and advantages will be apparent from the description and drawings, and from the claims if any are included.

The disclosure relates to at least one package or electronic assembly made by the methods disclosed herein. The package or electronic assembly includes at least one component 14 which may comprise any of an active device, a passive device, an IPD, a MEMS device, a sensor, a semiconductor chip, a transistor, a diode, a chiplet, an LED, a VCSEL, an RF device, a microwave device, a photonic device, and a bridge die.

Figure 1A:
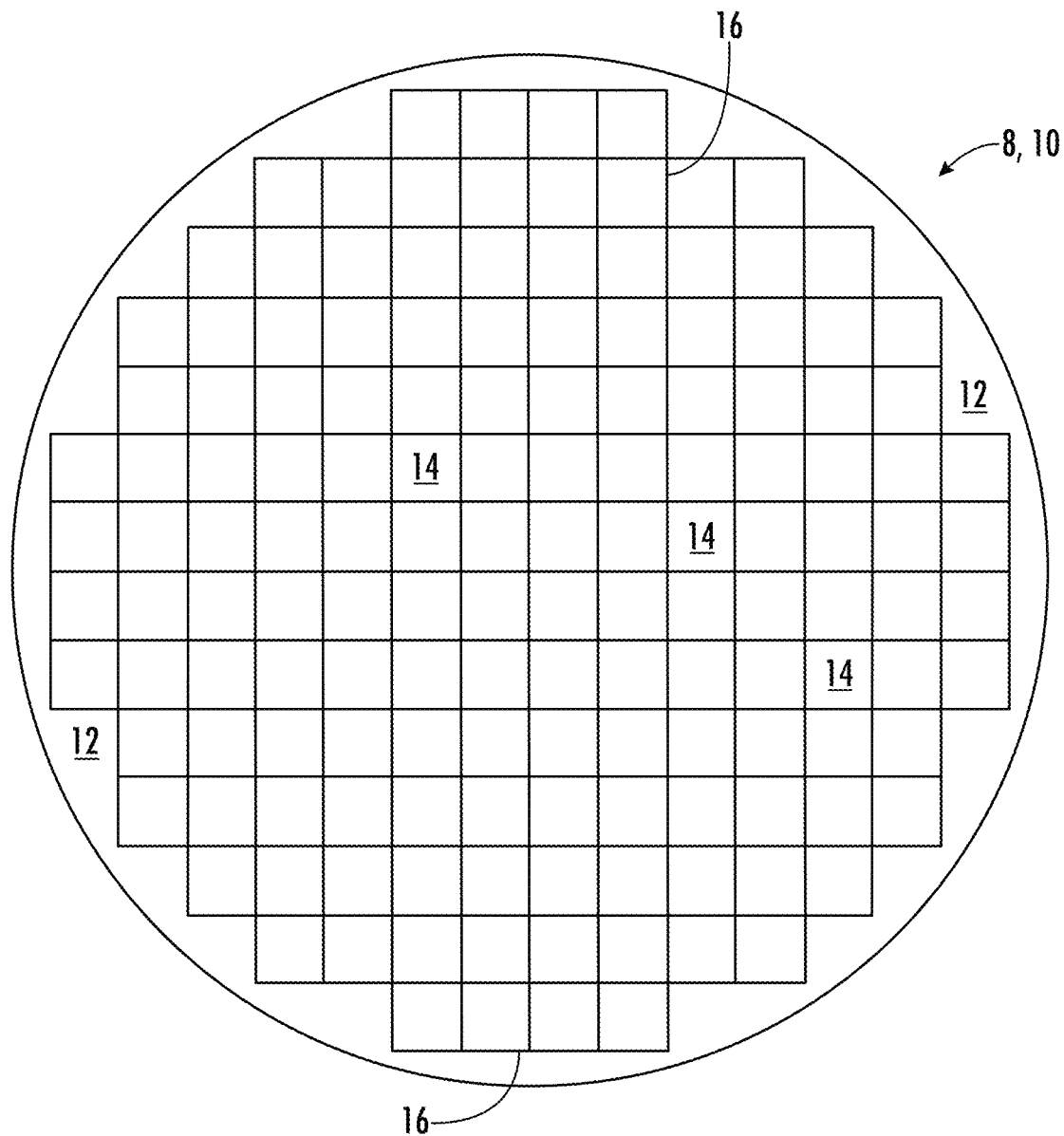
FIGS. 1A-1C are illustrations of components comprising electrical interconnects being singulated from a substrate or native wafer.

FIG. 1A shows a plan or top view of a substrate 8, which may comprise a semiconductor wafer or native wafer 10, with a base substrate material 12, such as, without limitation, silicon, silicon dioxide, germanium, silicon germanium, gallium arsenide, indium phosphide, gallium nitride, silicon nitride, or silicon carbide, for the base material 12 or structural support. A plurality of components 14 can be formed on wafer 10 and may be separated by a non-active, inter-component wafer area or saw street 16 as described above. The saw street 16 can provide cutting areas to singulate the semiconductor wafer 10 into the individual components 14 or semiconductor component 14. In other instances, the components 14 may comprise one or more integrated passive devices (IPDs), either passive or active bridge chips, interposers, or other suitable devices that become embedded devices can be formed on substrate 8, which may be formed of glass, ceramic, mold compound, laminate material, composite material, or other suitable material for providing structural support for subsequent processing.

Each component 14 may comprise one or more active devices, passive devices, or both active devices and passive devices. In some instances, component 14 may be formed without active and passive devices, and may be used for transmission or routing, such as by comprising through silicon vias (TSVs) for vertical interconnect. For example, in some instances, components 14 may be formed as a bridge chip with only electrical routing and with copper studs of the semiconductor chip electrically connected or coupled with wiring, routing, or a redistribution layer (RDL) disposed on the bridge chip. Component 14 may also comprise only a dummy substrate with no electrical function, but rather act as structural element, a thermal element or both and may or may not include copper studs. In some embodiments, component 14 may not include, and may be formed without, conductive studs 125. In yet other instances, the components 14 may be absent, or not present, or not places as finished components 14 on the intermediate carriers 112. Instead, built-up components 14 could be manufactured or built-up on, or over, the intermediate carries 112. As such, one or more built-up components 14 could be formed as molded RDL bridges. In any event, the built-up components 14 could then used in another, separate assembly process, such as where a processor and an HBM are at joined to the bridge or built-up component 14 that was made using the intermediate carrier 112.

The component 14 may comprise semiconductor chips and semiconductor die that comprise a backside or back surface 18, an active layer 20 and a front surface 21 opposite the backside 18. In some instances, both the active layer 20 and the backside or back surface 18 of the component 14 may be active. In any event, the component 14 may contain one or more analog, or digital circuits, diodes, or transistors implemented as active devices, conductive layers, and dielectric layers formed within or on the chip and electrically interconnected according to the electrical design and function of the semiconductor chip and may comprise a processor or logic device. In some instances, passive devices may also be integrated as part of the semiconductor chip or semiconductor die. The component 14 may comprise circuits that may include one or more transistors, a FET, a JFET, a MOSFET, a BJT, an IGBT, a SIT, a Schottky transistor diodes, and other circuit elements formed within the chip substrate and close to the front surface 21 to implement analog circuits or digital circuits, such as DSP, ASIC, memory, or other circuits. Circuits may include RF or microwave circuits, LED, LCOS, CIS, transistor, optoelectronic, MEMS and the like. The component 14 may also contain IPDs such as inductors, capacitors, and resistors, for RF signal processing, digital or analog power line control or other functions. The component 14 may be formed on a native wafer. In some instances, a wafer level process may be used to produce many packages simultaneously on a wafer. In other instances, the package may be formed as part of a reconstituted wafer and may comprise multiple components or chips molded together.

Figure 1B:
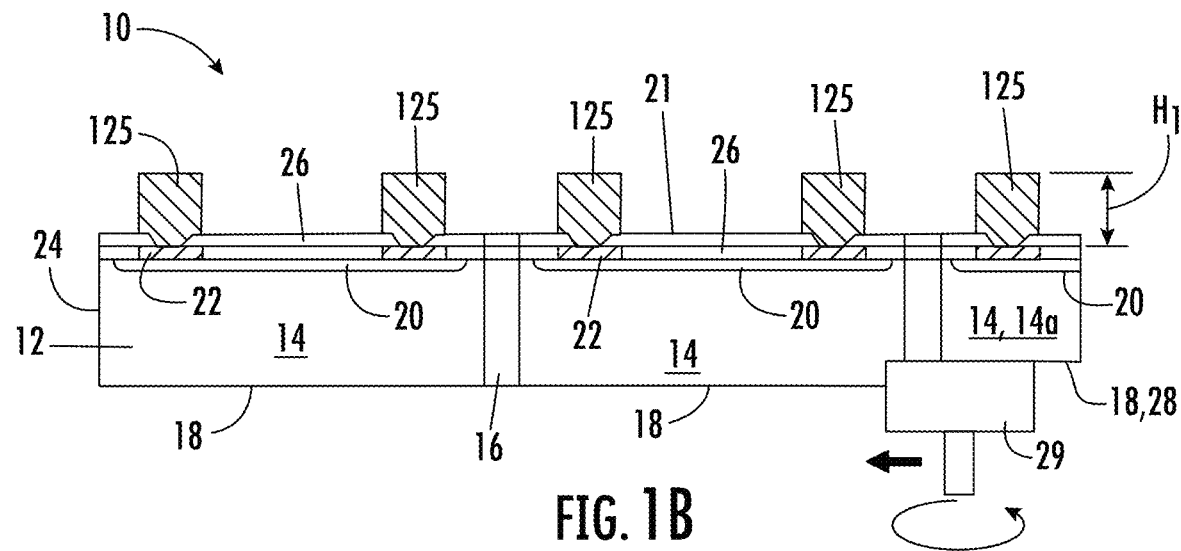

FIG. 1B illustrates a cross-sectional view of a portion of semiconductor wafer 10. Each component 14 is shown formed of base substrate material 12 and comprising a back surface or a backside 18, an active layer 20, and a front surface 21, opposite the backside 18. An electrically conductive layer or contact pads 22 is formed over active layer 20 using PVD, CVD, electrolytic plating, electroless plating process, or other suitable metal deposition process. Conductive layer or contact pads 22 can be one or more layers of aluminum (Al), copper (Cu), tin (Sn), nickel (Ni), gold (Au), palladium (Pd), silver (Ag), cobalt (Co), platinum (Pt), or alloys of those materials, or other suitable electrically conductive material. Conductive layer 22 operates as contact pads or bond pads electrically coupled or connected to the circuits, transistors, or diodes in the semiconductor substrate 10 near front surface 21. Conductive layer 22 can be formed as contact pads 22 disposed side-by-side a first distance from an edge 24 of component 14, as shown in FIG. 1B. Alternatively, conductive layer 22 can be formed as contact pads 22 that are offset in multiple rows such that a first row of contact pads is disposed a first distance from the edge 24 of the component 14, and a second row of contact pads alternating with the first row is disposed a second distance from the edge 24 of the component 14. In other instances, the component 14 can comprise digital chips, analog chips, or RF chips (or other chips) with more than two rows of contact pads and may further comprise contact pads 22 over the whole surface of the chip that do not follow a full grid pattern. Other components 14 may have contact pads in an array over the whole surface of the chip.

FIG. 1B also illustrates the semiconductor substrate 10 and components 14 can undergo an optional grinding operation with grinder 29 to reduce a thickness of the semiconductor substrate 10 and component 14 to form a first component 14a having a thickness which has been reduced. Other methods to reduce the thickness of the semiconductor substrate 10 such as plasma etching or wet etching, or thinning by using a diamond-based cutter as an alternative to, or in combination with, the optional grinding operation may be used and selection of the thinning process may depend on which base substrate material 12 the component 14 is made from.

FIG. 1B further shows one or more optional insulating, passivating, or dielectric layers 26 which may be conformally applied over active layer 20 and over conductive layer comprising contact pads 22. Insulating layer 26 can include one or more layers that are applied using PVD, CVD, screen printing, spin coating, spray coating, sintering, thermal oxidation, or other suitable process. Insulating layer 26 can contain, without limitation, one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having suitable insulating and structural properties. When insulating layer 26 is formed over conductive layer comprising contact pads 22, openings are formed completely through insulating layer 26 to expose at least a portion of conductive layer for subsequent mechanical and electrical interconnection using contact pads 22. In alternate embodiments, insulating layer 26 includes a passivation layer and conductive layer comprising contact pads 22 may be formed atop the insulating layer 26. In such an embodiment, no openings in the insulating layer 26 over contact pads 22 would be necessary. In some embodiments, insulating layer 26 includes a passivation layer forming front surface 21. In other embodiments where the conductive layer comprising contact pads 22 is not covered by insulating layer 26, front surface 21 may comprise the conductive layer.

FIG. 1B shows conductive studs 125 or electrical interconnect structures can be formed as conductive studs, bumps, thick pads, columns, pillars, posts, or conductive stumps and are disposed over, and coupled or connected to, contact pads 22. The conductive studs 125 can be formed directly on contact pads 22 using patterning and metal deposition processes such as printing, PVD, CVD, sputtering, electrolytic plating, electroless plating, evaporation, or other suitable metal deposition process. Alternately, conductive studs 125 may be formed in a position not vertically over the pads 22 and connected by RDL. Conductive studs 125 can be one or more layers of Al, Ti, TiW, Ta, Cu, Sn, Ni, Au, Ag, palladium (Pd), or other suitable electrically conductive material and can include one or more under-bump metallization (UBM) layers. In an embodiment, a photoresist layer can be deposited over component 14 and contact pads 22. A portion of the photoresist layer can be exposed and removed by a developing or other suitable process. Conductive studs 125 can then be formed as stud bumps, bumps, pillars or other structures as previously described in the removed portion of the photoresist and over contact pads 22 using a plating process. In some embodiments, copper may be used in a plating process. The photoresist layer and other appropriate layers, such as a seed layer for plating the conductive studs 125, can be removed leaving conductive studs 125 that provide for subsequent mechanical and electrical interconnection and a standoff with respect to active layer 20 and insulating layer 26 if present. In some instances, the conductive studs 125 include a height in a range of 1-100 micrometers (μm), 2-50 μm, or about 25 μm.

Conductive studs are conductive interconnect structures that may have generally vertical sides and be wider than tall. A conductive stud may differ from a pillar or post, each of which may have a height greater than its width. A conductive stud may comprise a cylindrical shape and may further be formed with a cross-sectional area that is circular, oval, octagonal, or as any polygonal or other shape and size. A conductive stud may be used for electrical interconnect, signal transmission, power, ground, or as a dummy thermal element that is not electrically coupled to an active electrical circuit but is instead thermally coupled to a heat source of an active device to dissipate the heat to another structure, such as to a die pad on a surface of the component 14. The generally vertical sides of a conductive stud are different from the sides shape that exists for a solder ball or a compressed or outwardly deformed solder ball that has generally rounded sides. The generally vertical nature of conductive studs comes from being formed in aa structure that has been previously developed or etched, such as within openings in a photoresist layer, which will also be generally vertical. Sides of the conductive stud may comprise imperfections or irregularities in shape that result from the developing or etching process, the photoresist material, or other materials and processes used. For example, developing or etching does not generally perfectly or uniformly remove the photoresist within the openings, and therefore forms imperfect, generally vertical openings for deposition of the conductive stud. The term "generally vertical" as used herein includes perfectly vertical and imperfectly vertical sides or sides that are about or substantially vertical or at an angle typically greater than 45 degrees. A conductive stud is not a wire bond and is not solder.

Figure 1C:
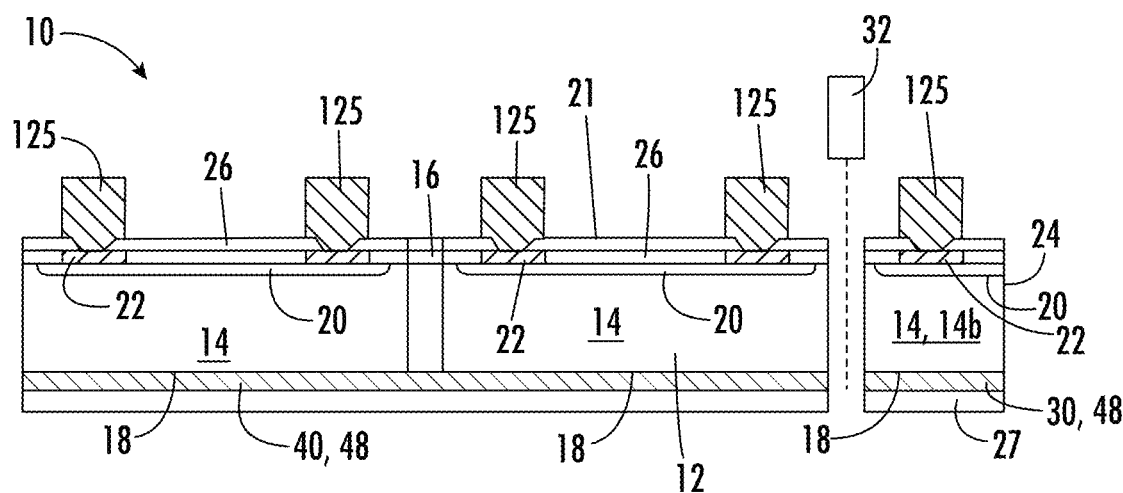

FIG. 1C further illustrates an optional adhesive or a (chip) die attach film (DAF) or material 27 may be attached to the back side 18 of a non-semiconductor wafer 8 or a semiconductor substrate or wafer 10, such as for subsequent mounting on a carrier. In some embodiments, semiconductor substrate or wafer 10 may comprise a pre-applied backside metal 48 applied as one-step of a wafer fabrication process. In other instances, a conductive backside material 30 may be applied according to the methods further disclosed herein. In some instances, the optional backside material 30 may be applied before being attached to, or disposed over, an intermediate carrier (IMC) 112, as shown in FIG. 1C. In other instances, the backside material 30 may be added after encapsulating or molding the components 14, and after removal of the IMC 112, as shown in FIGS. 3P, 3Q, 4G and 5H, or at any other suitable time.

Figure 3A:
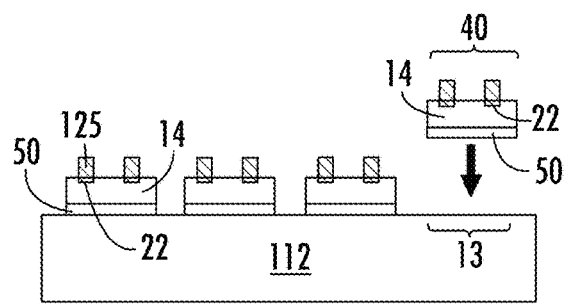
FIGS. 3A-3T show the formation of assemblies using intermediate carriers disposed on temporary carriers according to the methods as disclosed herein.
Figure 3B:
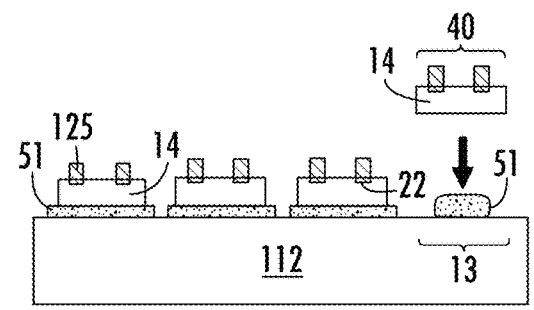
Figure 3C:
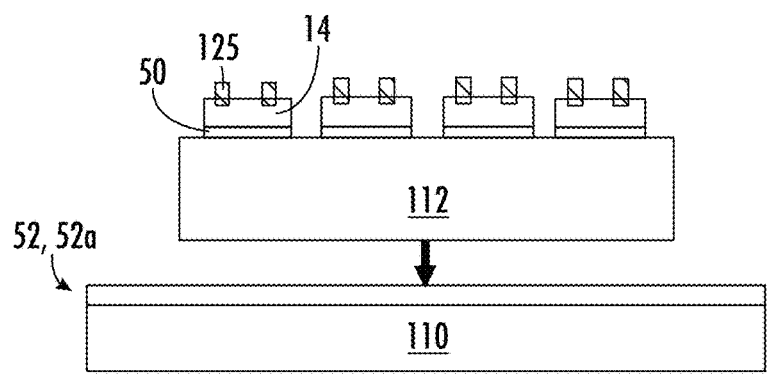
Figure 3D:
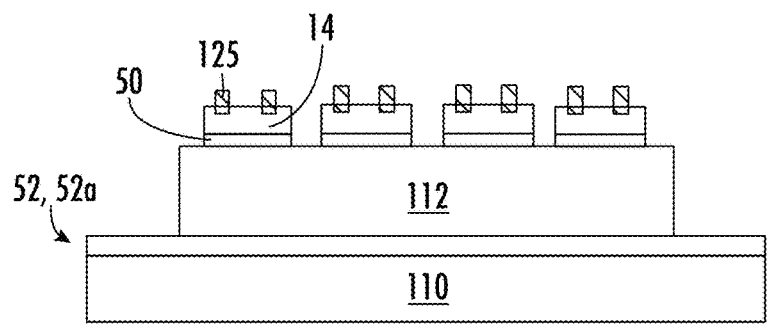
Figure 3E:
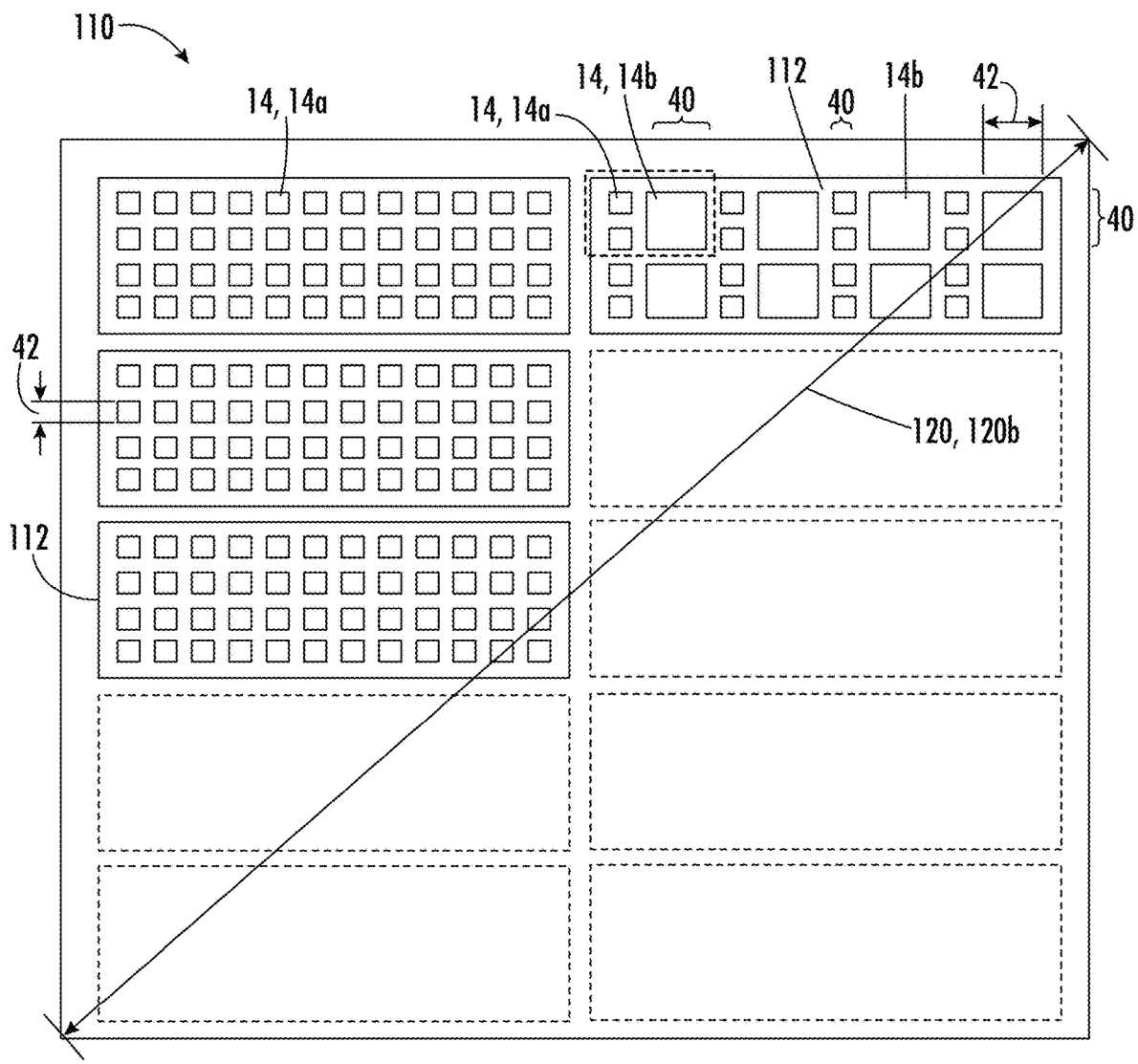
Figure 3F:
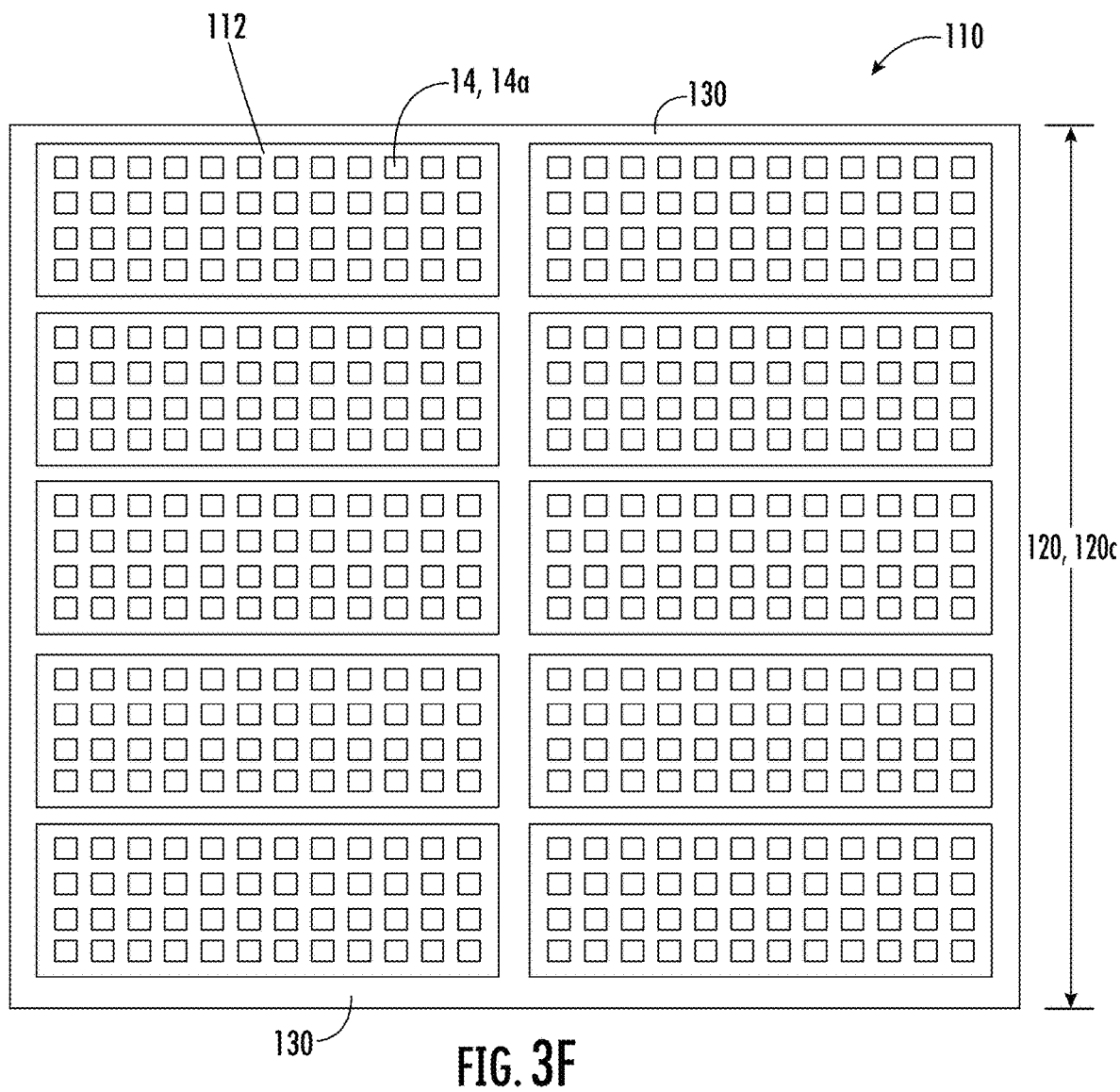
Figure 3G:
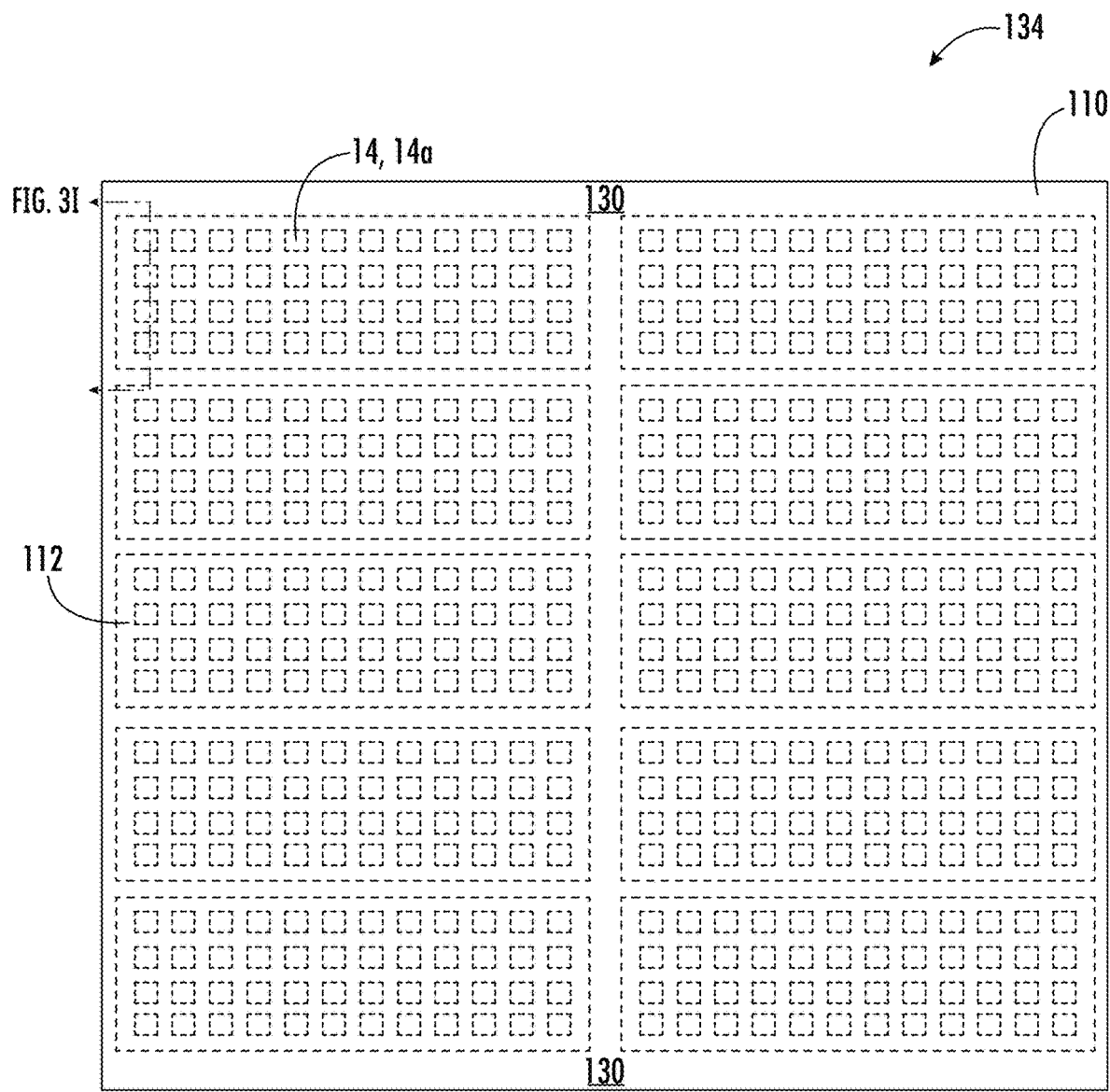
Figure 3H:
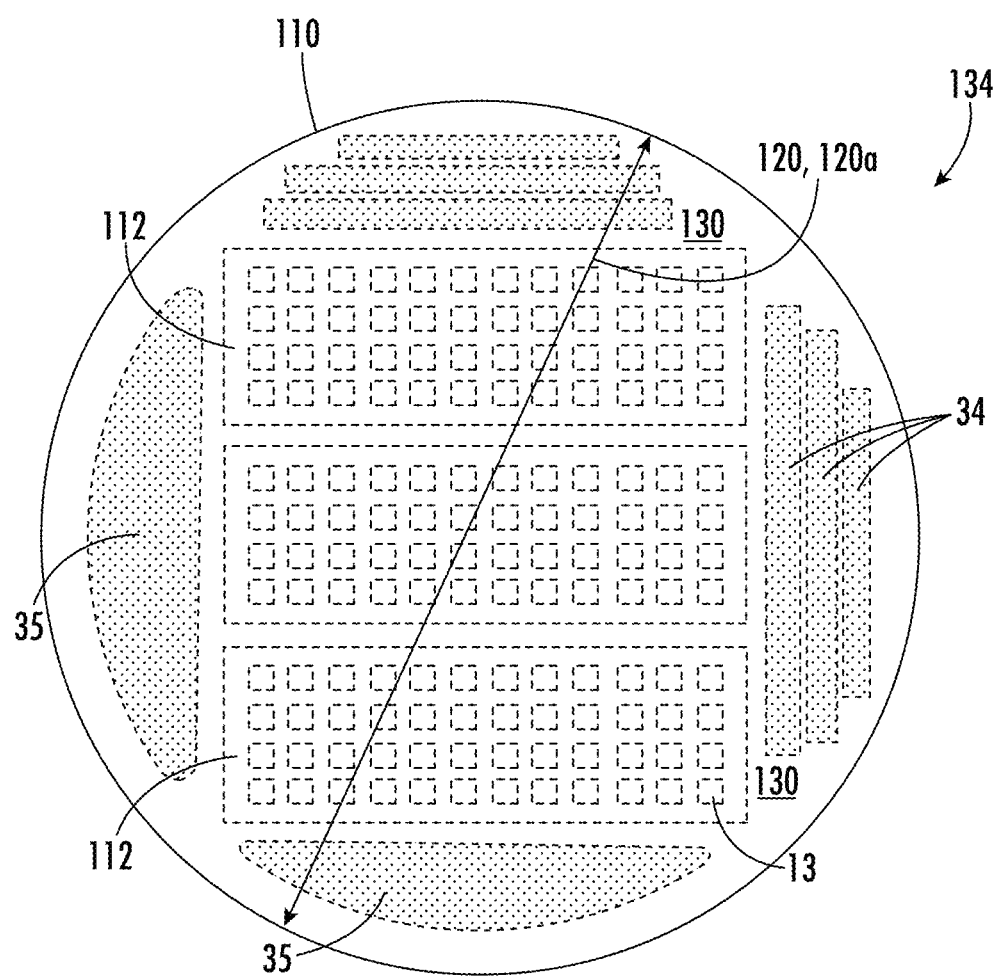
Figure 3I:
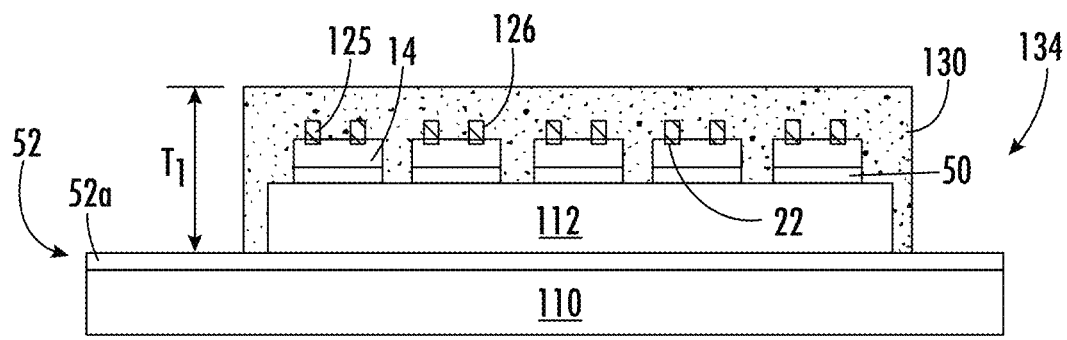
Figure 3J:
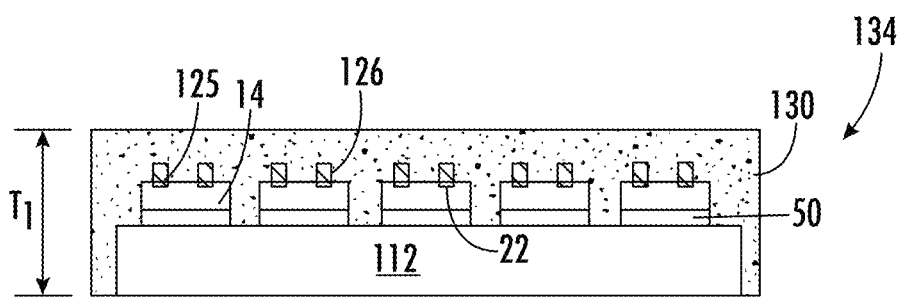
Figure 3K:
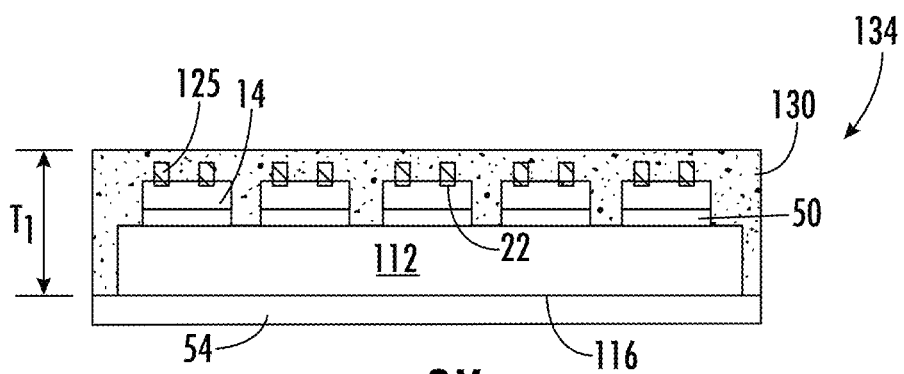
Figure 3L:
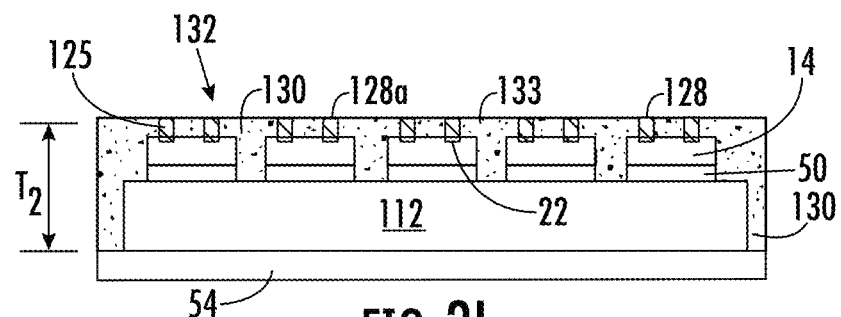
Figure 3M:
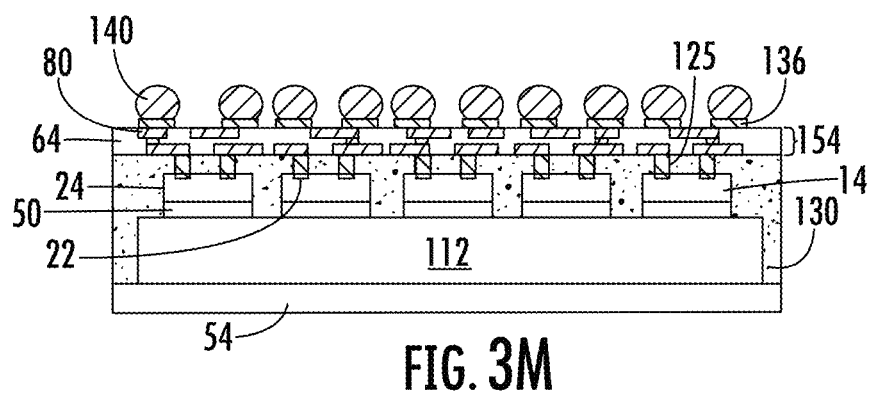
Figure 3N:
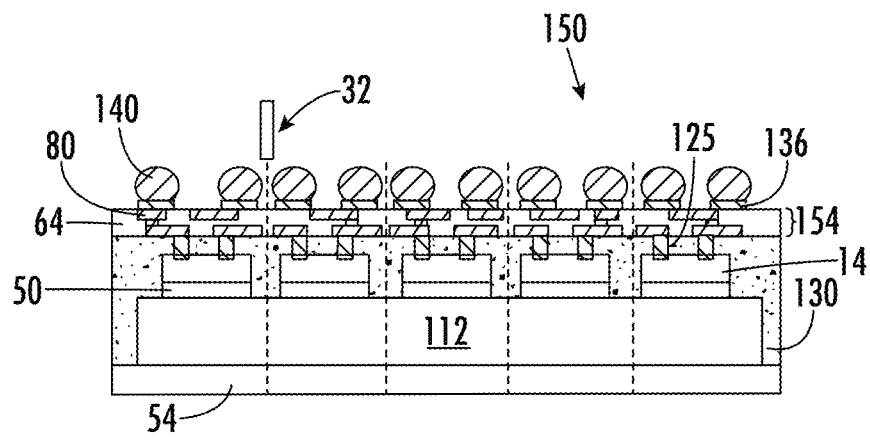
Figure 3O:
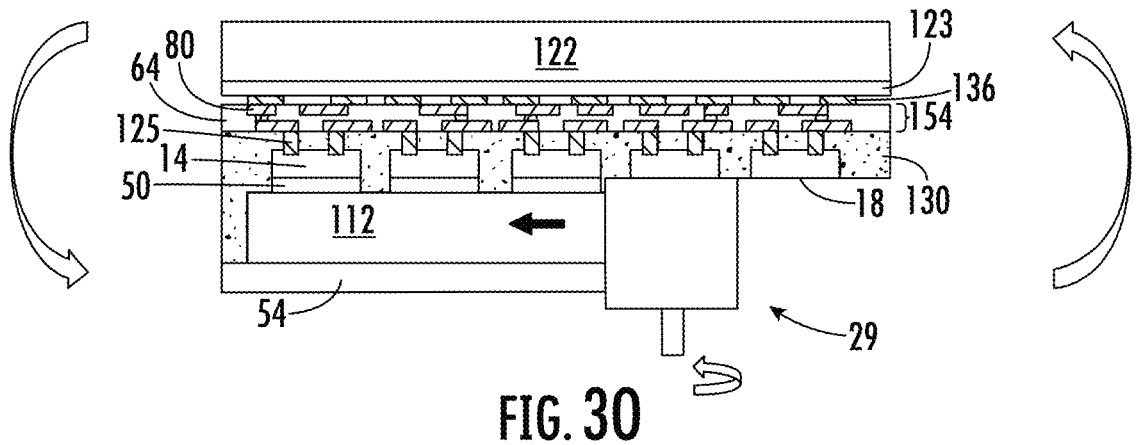
Figure 3P:
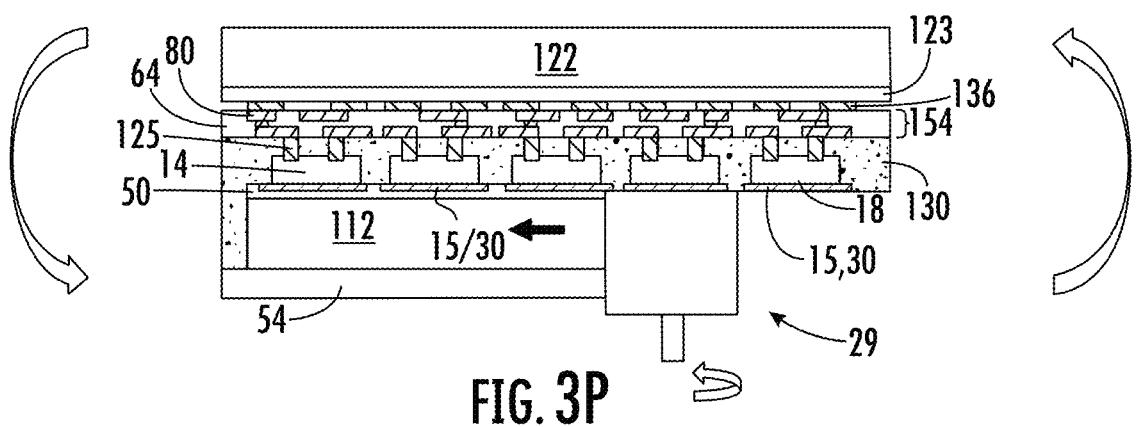
Figure 3Q:
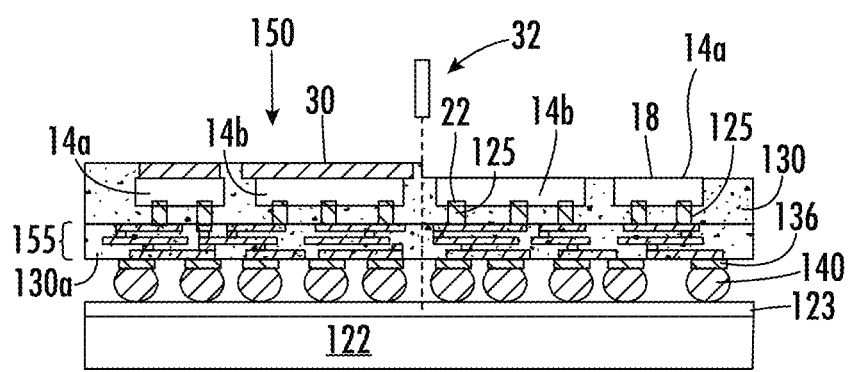

Backside material 30 can be a thermally conductive backside material 30 disposed over a portion or all of the backside 18 of the components 14, and a portion of the package encapsulant 130 as shown, e.g., in FIGS. 3P and 3Q. In some instances, the backside material 30 comprises metal, such as copper, or aluminum, or any other one or more layers of metals. The conductive backside material 30 may comprise a thickness in a range of 1,000 to 10,000 Angstroms (for thin applications) or 1-1500 μm (for thicker applications), and in some instances thicknesses in a range of 1-200 μm may be desirable. The thermally conductive backside material 30 may also comprise diamond-like carbon (DLC), graphite, carbon nanotubes (CNTs), or other carbon material. One or more of a solderable metal system (SMS), an organic solderability preservative (OSP), or oxidation-resistant metal or metal alloy may be disposed over the backside material 30 to resist oxidation, and over at least a portion of the package interconnect pads 136 as shown in FIG. 3M and described following. Alternatively, a metal that does not readily oxidize, such as Ni, Ti, W, Cr, Ag, Au, Pd, or other suitable material can be deposited over the thermally conductive backside material 30. The SMS or metal that does not readily oxidize may be formed by, electroplating, electroless plating, immersion plating, physical vapor deposition (PVD), or chemical vapor deposition (CVD) hot dipping or other deposition method of the conductive material over the conductive pads.

In some embodiments an electrical contact such as a metal via or a silicide region is exposed on the backside 18 of component 14. In some embodiments and with proper preparation of the backside 18 some metals can form an ohmic electrical contact to the semiconductor substrate 10 without the need for a silicide region or a metal via. For example, Al can form an ohmic contact to a silicon substrate. In other embodiments the backside 18 of component 14 is not sensitive to an electrically conductive material being present. In both of these cases a metallization process that deposits an electrically conductive metal directly on the backside 18 and any contacts that are present may be used. A deposition typically begins with a barrier layer, an adhesion layer (or a single layer that serves both functions as a barrier and for adhesion may be used) that will adhere to the backside 18, and may also serve as a barrier to ion migration into the component substrate. Typical barrier and adhesion metals are Ti, TiN, Ta, TaN, W, Cr, V, Ni, or alloys thereof deposited by a PVD process. The same PVD process can deposit a thin seed layer of conductive material such as Cu. After the barrier and adhesion layer deposition (and seed layer deposition if there is one) a relatively thick layer of the thermally conductive material 30 can be deposited-such as by electroplating, electroless plating, PVD, CVD, or other suitable process.

In some embodiments it is desirable to have the backside 18 electrically isolated from the thermally conductive backside material 30, wherein an insulating layer 28 may be formed or disposed on backside 18 before the thermally conductive backside material 30 is deposited. The insulating layer 28 may be polyimide or other type of polymer (which may be spun on or otherwise deposited). The insulating material 28 may be an inorganic dielectric that could be thinner than a polymer and also have a higher thermal conductivity-such as silicon oxide, silicon nitride, an oyxnitride, an SiOC material or the like deposited in a CVD-type process. A number of variations of the CVD process may be used, such as plasma-enhanced, ultra-high vacuum, inductively-coupled plasma, or other that all help to achieve a low deposition temperature that is compatible with the encapsulant 130. Another option for the insulator is a spin-on glass (SOG) or a vacuum-deposited polymer. Once such an insulator is deposited then the formation of the thermally conductive backside material 30 can proceed in a similar fashion as described previously.

As previously mentioned, the thermally conductive backside material 30 may comprise diamond-like carbon (DLC), graphite, or carbon nanotubes (CNTs) or other carbon-based material. Alternately the thermally conductive backside material 30 may comprise a metal. The carbon-based materials can be deposited by CVD processes, sol-gel processes or other deposition processes. The metal materials can be deposited by electroplating, electroless plating, immersion plating, PVD, or other methods.

FIG. 1C also illustrates wafer 10 can be singulated with a saw, a plasma, a laser, or wafer cutting tool 32 into individual components 14 through saw streets 16 using one or more of a saw blade, a laser cutting tool, a plasma cutting tool, a stealth laser process, and a scribe and break process. In some instances, the components 14 will have a thickness in a range of 2-780 micrometers (μm). This range may include a full thickness of a standard semiconductor wafer. In other embodiments, the components 14 may be thin, and have a thickness C1, for a 300 millimeter (mm) wafer in a range of about 2-500 µm, 2-350 µm, or 2-125 µm such as for thin ground wafers. In other embodiments, such as for 600 mm square or rectangular panels, the components 14 may be thin, and have a thickness C1 of about 500 µm or more for thin ground wafers. For thick ground wafers, the components 14 will have a thickness, C1, in a range of about 350-750 µm for a 300 mm wafer, or from about 500-780 µm for a 600 mm square or rectangular panel. In some embodiments, the component 14 may be very thin—from 2-20 µm, 20 µm or less, or about 10 µm in thickness.

While FIGS. 1B and 1C depict conductive studs 125, in other embodiments, components 14 may not comprise conductive studs 125, as shown in the disclosure following relating to FIGS. 4A-4H, and 5A-5H. In such embodiments, components 14 may be disposed over intermediate carriers 112 and formed according to the methods and embodiments following.

Some aspects of the disclosure concern methods of making a plurality of semiconductor assemblies, comprising: providing a plurality of components 14 comprising conductive studs 125 disposed over a front surface 21 of the plurality of components 14; providing one or more intermediate carriers 112; mounting the plurality of components 14 to the one or more intermediate carriers 112; providing a temporary carrier 110; mounting the one or more intermediate carriers 122 to the temporary carrier 110, wherein the one or more intermediate carriers 112 comprise the plurality of components mounted 14 to the one or more intermediate carriers 112; disposing an encapsulant 130 over the one or more intermediate carriers 112 and over the plurality of components 14 mounted to the one or more intermediate carriers 112 after the one or more intermediate carriers 112 are mounted to the temporary carrier 110 so as to form a reconstituted panel 134, wherein the encapsulant 130 is disposed around four side surfaces of each of the plurality of components 14, over the front surface 21 of each of the plurality of components, and contacting at least a portion of the sides 126 of the conductive studs 125, wherein the encapsulant 130 may further be disposed over or contact, the top of the one or more intermediate carriers 112, one or more sides of the intermediate carriers 112, or both; and removing a portion of the encapsulant 130 to form a substantially planar surface 132 over the front surface 21 of the plurality of components 14, wherein the substantially planar surface 132 comprises ends 128 of the conductive studs 125 and a planar surface 133 of the first encapsulant layer 130.

As used herein "large" with respect to the temporary carrier 110 means that the temporary carrier 110 is larger than the intermediate carriers 112, such that the temporary carrier 110 holds, or may have mounted thereto, one or more of the intermediate carriers 112. Some temporary carriers 110 may comprise a diameter 120a, a diagonal 120b, or edge length 120c in a range of 300-1,000 millimeters. Some temporary carriers have a diameter, 120a, of about 300 mm. Certain temporary carriers are rectangular or square, as shown in later figures such as FIGS. 3E and 3F, and have an edge length 120c of 600 mm×600 mm. Some temporary carriers have a diagonal, 120b, of from 750 mm to 850 mm. Temporary carriers 110 may be made of any suitable material that may be rigid, low cost, or both, and that provides structural support and is resistant to deformation at elevated temperatures. The temporary carriers 110 may comprise a number of metals, plastics such as thermoset plastics, graphite, ceramic, mold compounds, glass, carbon fiber or composite materials. In some embodiments, the temporary carriers 110 can comprise a molding carrier.

Figure 2A:
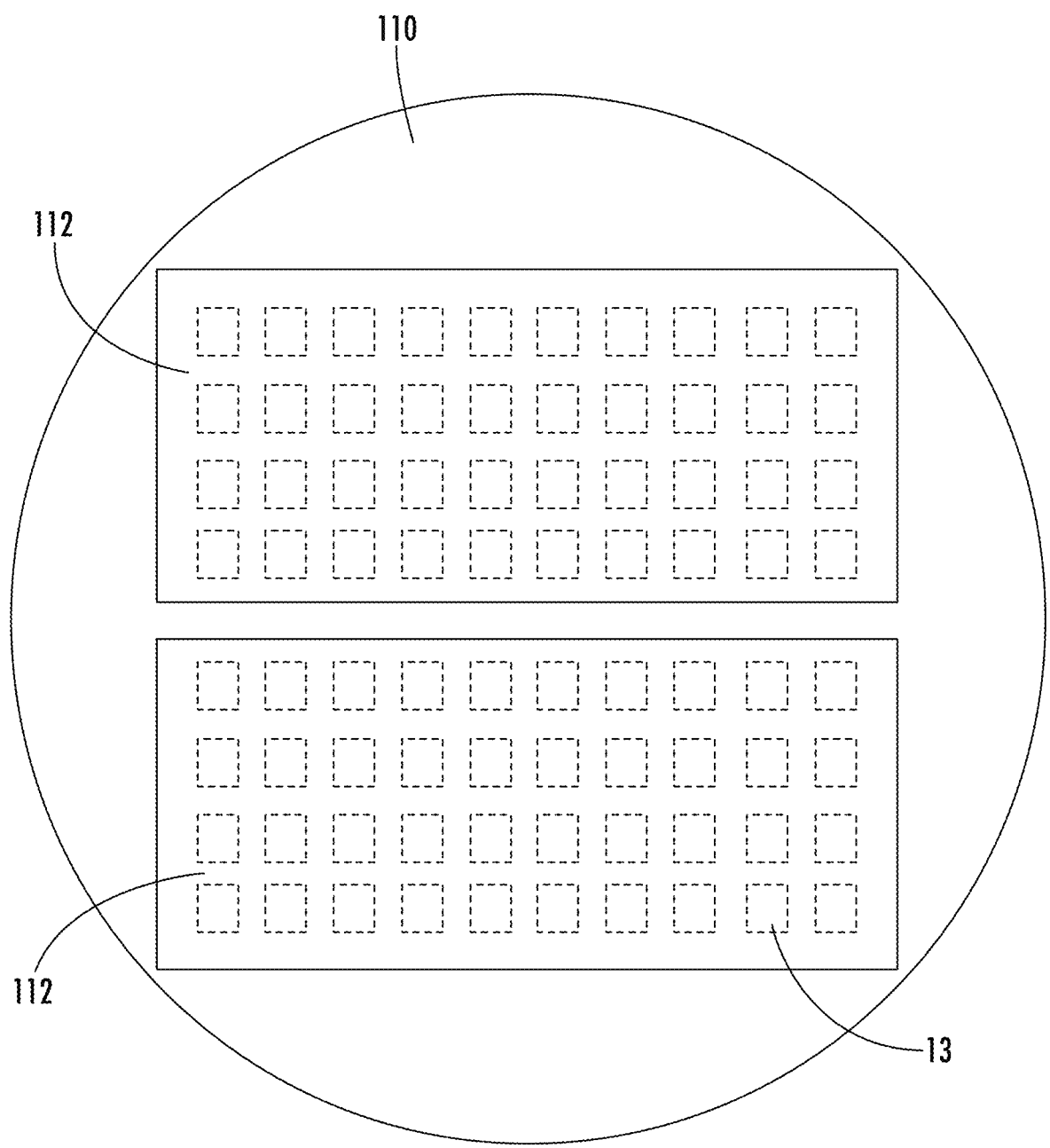
FIGS. 2A-2C are depictions of intermediate carriers disposed on temporary carriers.
Figure 2B:
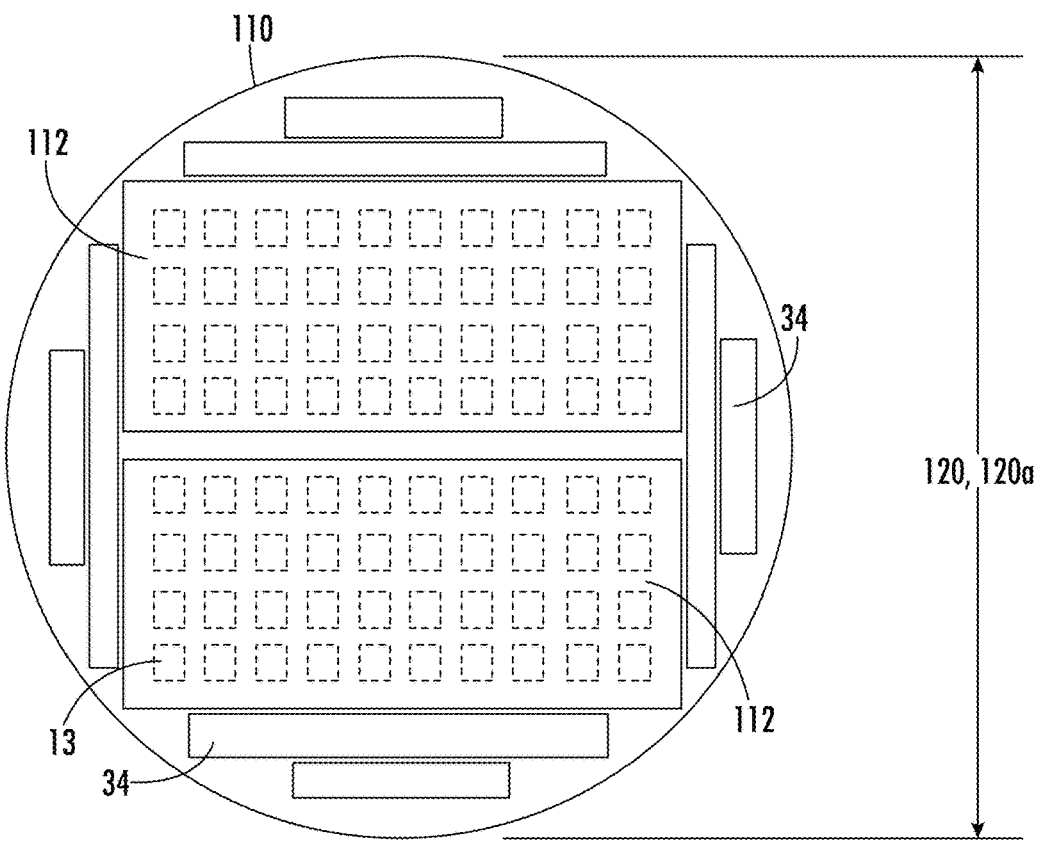

The exemplary temporary carrier 110 of FIG. 2A shows two IMCs 112 comprising a plurality of component mounting sites 13 disposed on temporary carrier 110. As depicted in FIG. 2B, the temporary carrier 110 may have a diameter 120a of between 300-1,000 millimeters. The IMCs 112 may be coupled to the temporary carriers 110 as further described with respect to FIG. 3C following.

FIG. 2B shows the temporary carrier 110 comprising IMCs 112 of FIG. 2A, further illustrating additional die 34, which may be "dummy" die with no electrical function, but rather act as structural elements for support during processing. In other embodiments, additional die 34 may comprise passive devices, or active devices containing one or more analog, or digital circuits implemented as active devices. The additional die 34 may be formed from the semiconductor substrate 10 and base substrate materials 12 as disclosed herein, or other materials having similar properties.

Figure 2C:
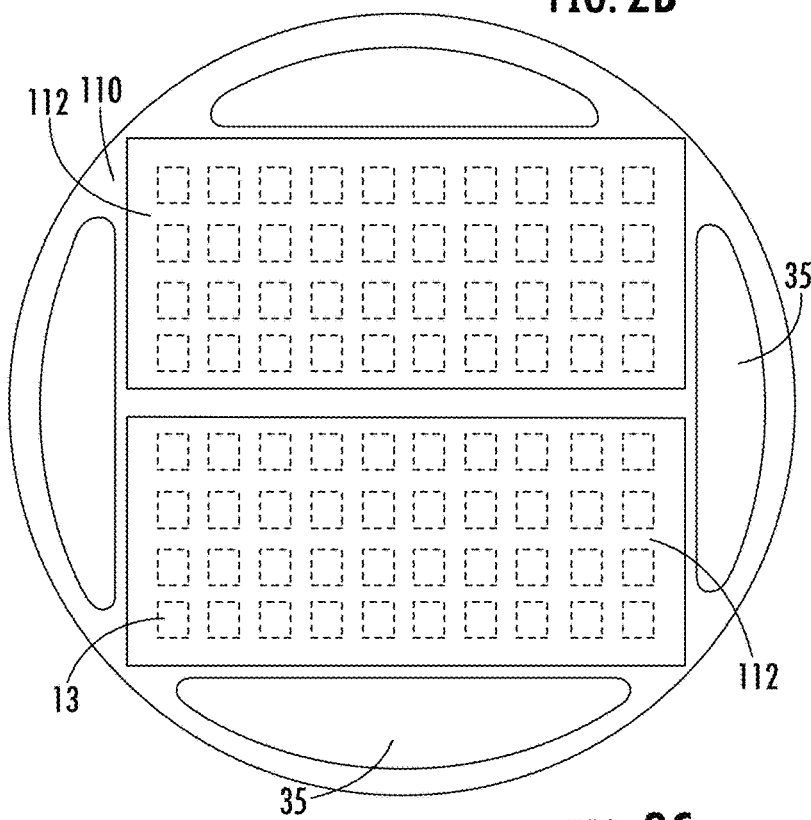

FIG. 2C depicts the temporary carrier 110 comprising IMCs 112 of FIG. 2A, further showing support elements 35 having no electrical function, but providing structural support to the temporary carrier 110 during processing. The support elements 35 may comprise a shape configured to maximize coverage of a periphery of the temporary carrier 110. The support elements 35 may be formed from the base substrate materials 12 or the intermediate carrier materials as disclosed herein, or other materials having similar material properties, whether semiconducting materials or not.

The additional die 34 and support elements 35 may be coupled to the temporary carrier 110 as further described with respect to FIG. 3C following and disposed around a periphery, or any portion of the temporary carrier 110 requiring structural support during processing.

Figure 2D:
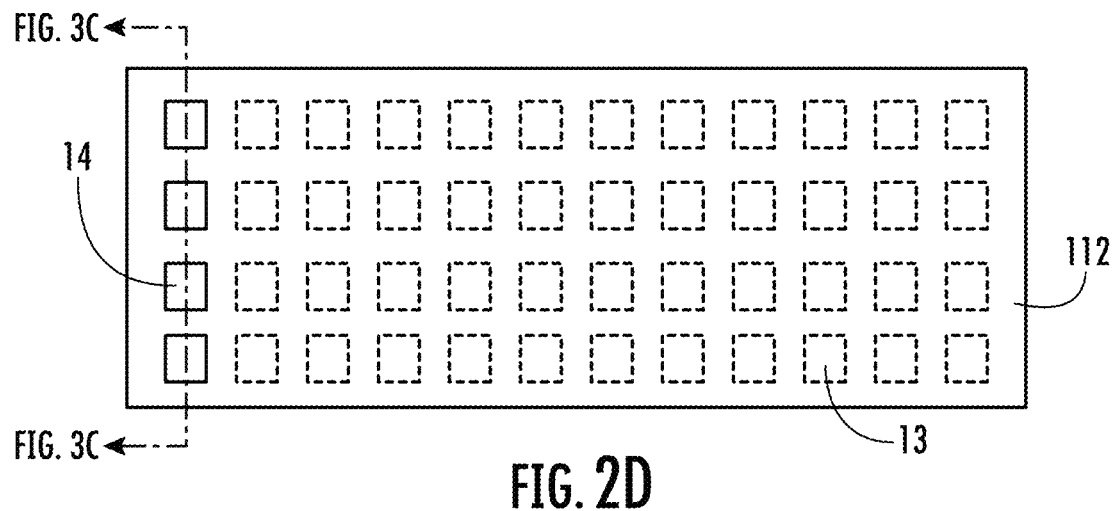
FIGS. 2D-2E show intermediate carriers in various stages of being populated with components.
Figure 2E:
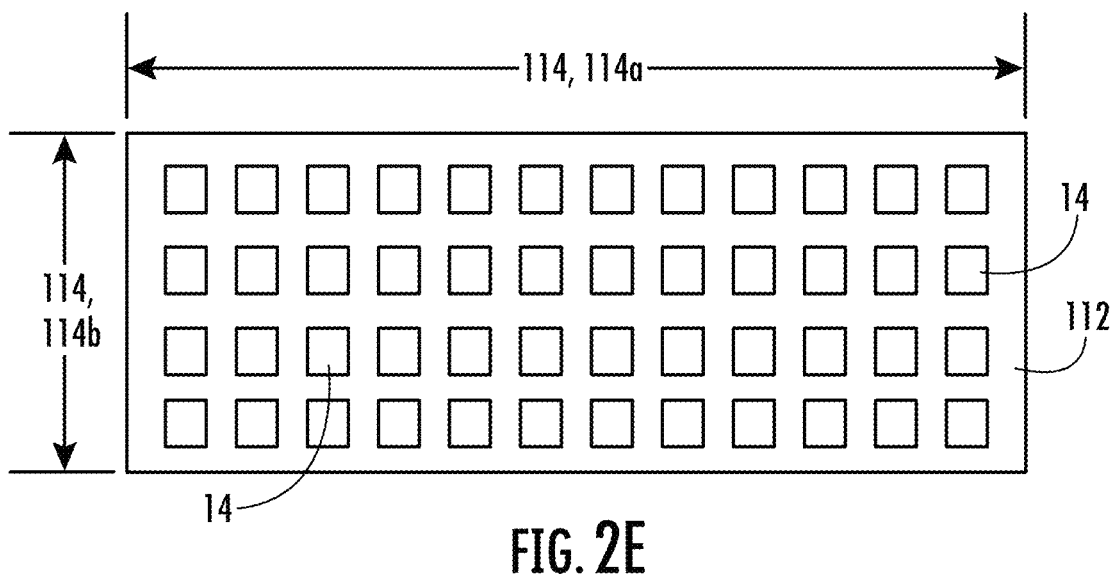

As shown in FIGS. 2D and 2E, a plurality of components 14 with conductive studs 125 disposed over a front surface 21 of the plurality of components 14 (not depicted here for simplicity, but illustrated in FIG. 3A and others) can be mounted on a one or more intermediate carriers 112. The plurality of components 14 may be mounted in a face up configuration such that conductive studs 125 are disposed in a direction away from the IMC 112 as shown in FIG. 3A. "Face up" as used herein means that components 14 are mounted such that a front surface 21, active layer 20, or conductive studs 125 are oriented away from the intermediate carrier 112, and similarly, "face down" means that components 14 are mounted such that a front surface 21, active layer 20, or conductive studs 125 are oriented towards the intermediate carrier 112. The plurality of components 14 may comprise one or more of: an active device, a passive device, an IPD, a MEMS device, a sensor, a semiconductor chip, a transistor, a diode, a chiplet, an LED, a VCSEL, an RF device, a microwave device, a photonic device, and a bridge die. The plurality of components 14 may be taken from one or more of a native wafer, a tape and reel, a tray, or other shipping medium.

The plurality of components 14 may comprise a footprint 40 with edge lengths 42 (as shown in FIG. 3E) in a range of 0.15-25 mm, or 0.15-3.0 mm, or with edge lengths 42 greater than 25 mm. In other instances, the plurality of components 14 may comprise a footprint 40 with edge lengths 42 in a range of at least 25.0 mm. In further instances, the plurality of components 14 may comprise a footprint 40 with edge lengths 42 in a range of 0.15-0.8 mm. In some instances, each of the intermediate carriers 112 will comprise components 14 of about the same size, while in other instances different intermediate carriers 112 may comprise components 14 of different sizes or of different types, such as for multichip applications, chip plus MEMs, or other desired applications.

In any event, with thin or very thin components 14, as described above, the components 14 may be easily broken (even by routine handling process during packaging), and as such, the components 14 may avoid undesired breakage by being placed on intermediate carriers 112, which are able to provide additional structural support and for ease of packaging and subsequent processing. In some embodiments, the plurality of components 14 may be retrieved from a native wafer, tape and reel, a tray, or other shipping media, before being placed on the intermediate carrier 112.

In some cases, the equipment to pick small components from a native wafer, tape and reel, and a tray and place them onto another substrate has limitations on the size of the substrate it can accommodate. In some cases, the pick and place equipment cannot accommodate a temporary carrier size and thus it is advantageous to have an intermediate carrier of a size that the pick and place equipment can accommodate.

FIG. 2D, included below, illustrates a row of components 14 mounted on an intermediate carrier 112, the intermediate carrier 112 comprising a plurality of mounting sites 13 for additional components 14. FIG. 2E shows an intermediate carrier 112 which is fully populated with multiple rows of components 14 mounted thereon. As stated above, components 14 may comprise conductive studs 125, not shown here for simplicity but depicted in FIG. 3A and others. The intermediate carriers 112 may have edge lengths 114 where the edge lengths comprise a length, 114a and a width 114b. In a particular embodiment, the intermediate carriers 112 may have a width, 114b of 100 mm by a length, 114a, of 300 mm, but these can come in different sizes depending on circumstances. Some intermediate carriers 112 may have a width, 114b of 70 mm by a length, 114a of 250 mm, or in other embodiments the IMCs 112 may have widths 114b of 90-95 mm by lengths 114a of 290-295 mm. Size can be optimized for other processes or based on the number of components 14 that are mounted on the intermediate carrier 112 and the need to maintain a gap between the components 14. Size of the IMC 112 can be based on the size that can be accommodated on the pick and place equipment. In certain embodiments, the intermediate carrier 112 can be as small as a square having an edge length 114 of from 35 mm×35 mm, or an edge length 114 of 300 mm×300 mm. Intermediate carriers 112 may comprise from a few, or tens, or hundreds of components to about 30,000-60,000 components, or about 51,000 components, within a single IMC 112 dependent upon component 14 edge length 42, and IMC 112 edge length 114. The intermediate carriers 112 can be made of any suitable material that may be rigid, low cost, or both, and that provides structural support as further described with respect to FIG. 2G following.

Figure 2F:
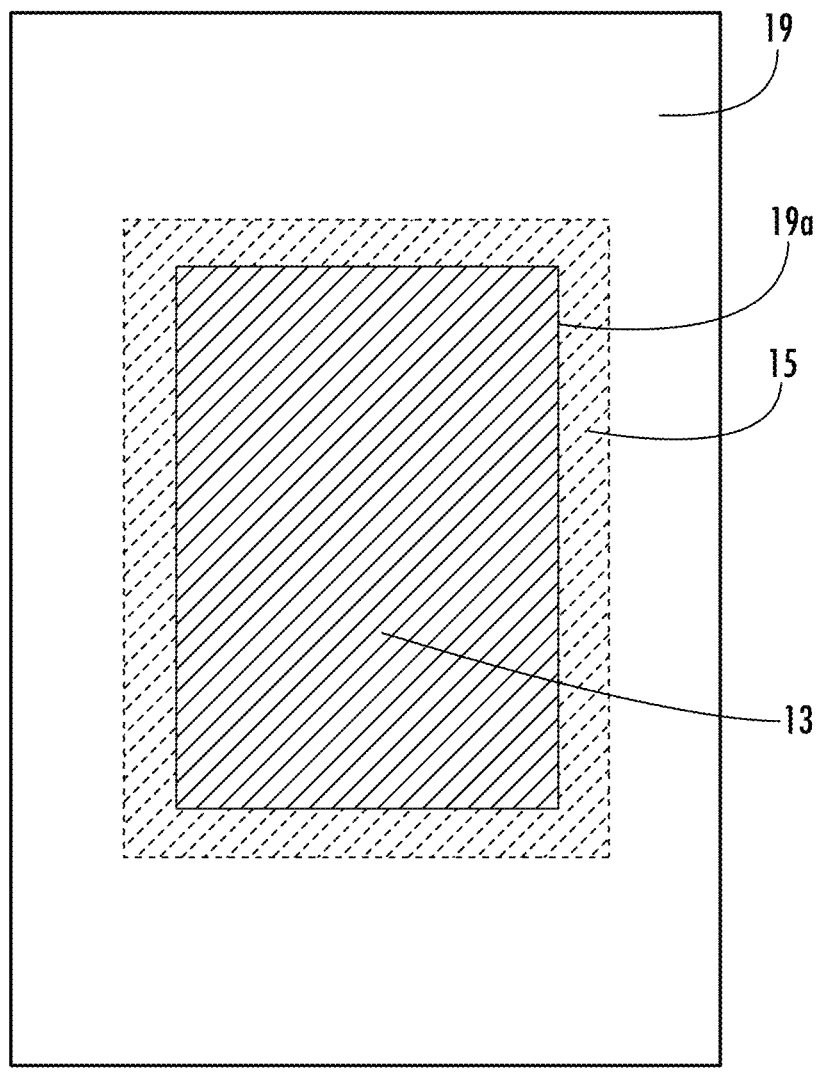
FIGS. 2F-2H illustrate details of a component mount site.
Figure 2G:
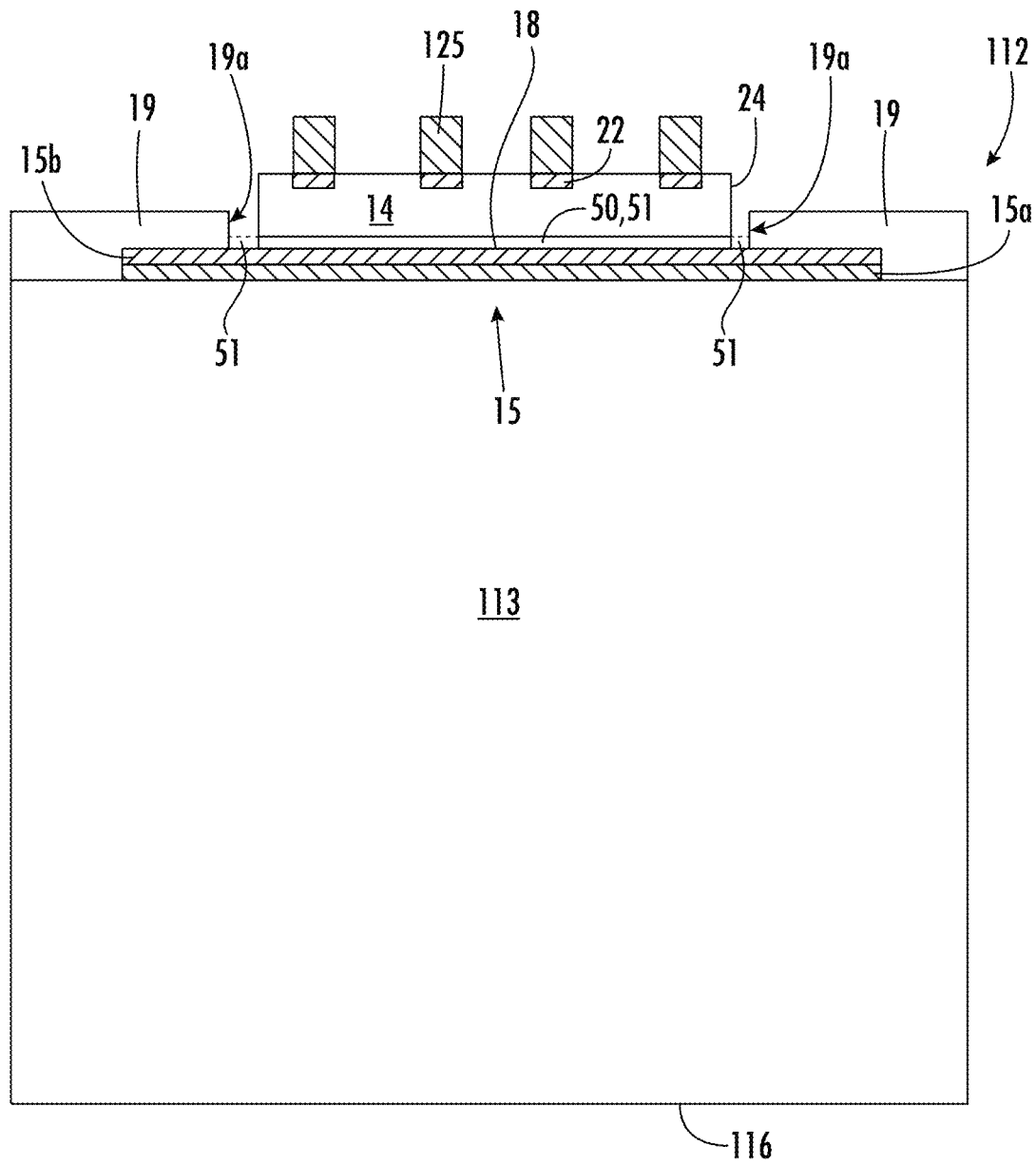
Figure 2H:
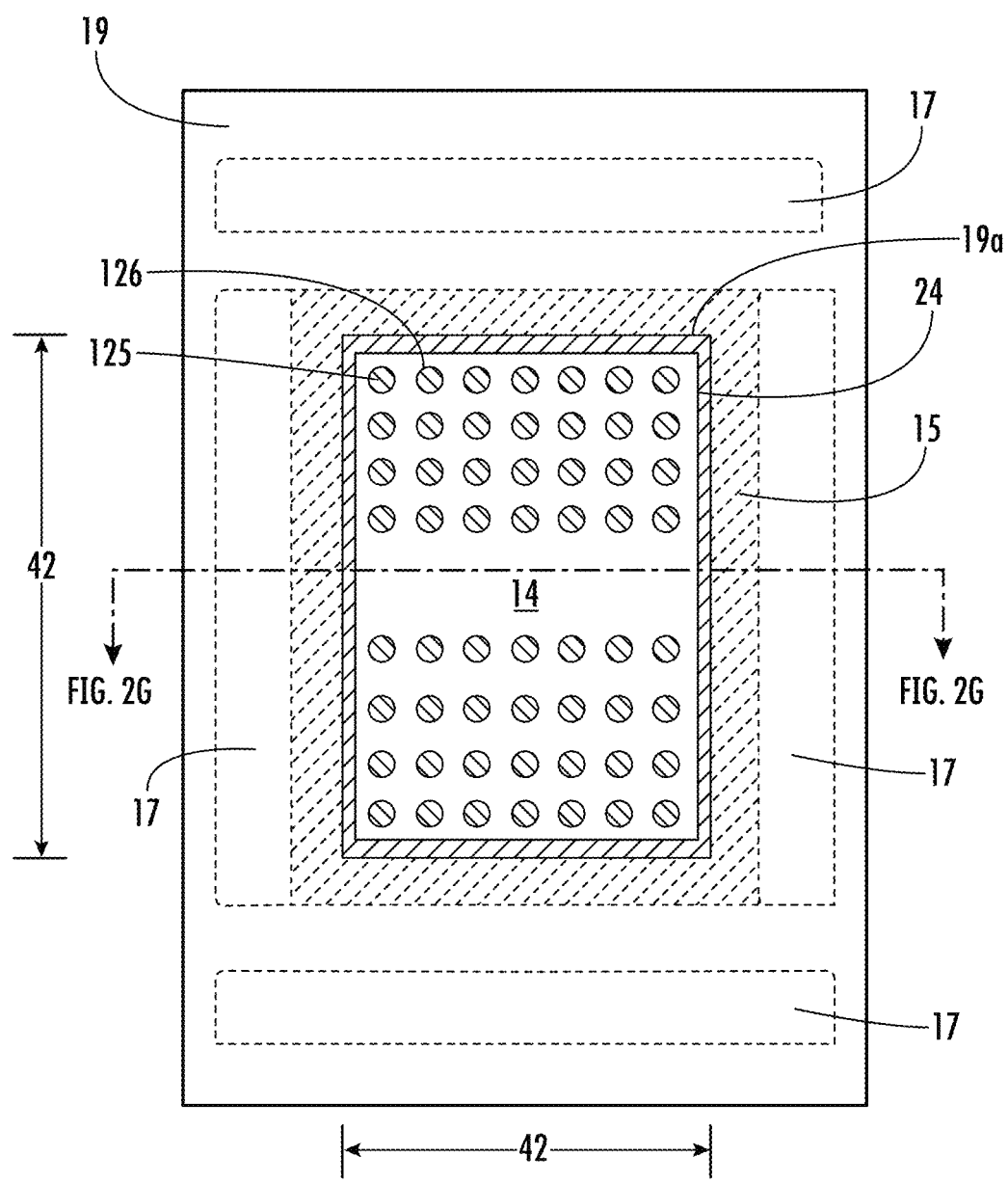

FIGS. 2F-2H show details of the component mount site 13 both with and without thermal frame 17.

FIG. 2F, shows a detailed view of the component mount site 13 of FIG. 2D, illustrating a plan or top view of component mount site 13 for placement and bonding of component 14 to IMC 112. Component mount site 13 comprises solder mask 19 and component pad 15. In some embodiments, solder mask 19 may extend over at least a portion of component pad 15 such that solder mask opening 19a is within an area of the component pad 15. Component pad 15 may be formed of a number of conductive layers, as depicted in FIG. 2G following. In some embodiments, the component mount site 13 and the intermediate carrier 112 do not comprise a solder mask 19.

FIG. 2G shows a cross-sectional view taken along the section line shown in FIG. 2H, showing component 14 comprising conductive studs 125 mounted face up within solder mask opening 19a atop conductive component pad 15, and may be affixed thereto with die attach film 50 (as shown in further detail in FIG. 3A) or die attach paste 51 (as shown in further detail in FIG. 3B). In some instances, component pad 15 is a good thermal conductor and comprises one or more layers of metal, including: copper, aluminum, silver, gold, tungsten, molybdenum, nickel, titanium, vanadium, other suitable metal, graphite, graphene, carbon nanotubes (CNTs), diamond-like carbon (DLC), or other suitable carbon materials, glass, ceramics, including aluminum nitride (AlN) and boron nitride (BN), and other suitable materials. In other instances, the component pad 15 is a good electrical conductor and comprises one or more layers of metal, including: copper, aluminum, silver, gold, tungsten, molybdenum, nickel, titanium, vanadium, other suitable metal, graphite, graphene, carbon nanotubes (CNTs), or other suitable carbon materials, indium tin oxide (ITO), and conductive polymers. In other instances, the component pad 15 is both a good thermal conductor and a good electrical conductor and comprises one or more layers of metal, including: copper, aluminum, silver, gold, tungsten, molybdenum, nickel, titanium, vanadium, other suitable metal, graphite, graphene, carbon nanotubes (CNTs), or other suitable carbon materials, and conductive polymers. In yet other instances, the component pad 15 is a good thermal conductor and a poor electrical conductor and comprises one or more layers of diamond-like carbon (DLC), glass, and ceramics. Conductive layers 15 can also block light to the die, chip, or component 14, or provide other desirable benefits.

In some embodiments, component pad 15 may comprise one or more layers, such as a base layer 15a and an outer layer 15b, both of which may be formed from the aforementioned materials according to desired properties of the final electronic assembly 150. However, other layers than those as shown and described are possible. Component pad 15 may comprise at least base layer 15a and outer layer 15b. In some embodiments, base layer 15a may comprise a copper seed layer having a thickness of about 1000 Angstroms to facilitate deposition of subsequent layers such as additional copper layers to increase a thickness of base layer 15a. In one embodiment, component pad 15 may comprise a base layer 15a comprising copper, and an outer layer 15b comprising layers of nickel and gold. More specifically, base layer 15a may comprise copper, and outer layer 15b may comprise at least one layer of electroless nickel and at least one layer of immersion gold. In particular embodiments, outer layer 15b may comprise an electroless nickel layer having a thickness of about 5 µm and an immersion gold layer having a thickness of about 0.05-0.23 µm. As shown, backside 18 of the components 14 may optionally be placed within a solder mask opening 19a (based on design specifics) on component pad 15 to couple the components, whether electrically, thermally or both, 14 to the IMC 112.

In instances where the intermediate carrier 112 comprises FR4 or CEM, a PCB material may be part of the intermediate carrier 112 such that build-up copper with a seed layer and plated up portion would not be formed. Rather, a copper clad material (a laminate of copper foil and an FR4 or CEM core) could be used instead. The copper clad material can be single-sided (copper only on one side of the FR4/CEM). Any suitable foil thicknesses and various standard FR4/CEM thicknesses could be used such that the copper clad material-rather than build up the pads, could be patterned using photolithography or other suitable process. For example, photolithography could be used to define a desired pattern, with the photoresist remaining on the pad. The uncovered portion of the metallic layer, such as exposed copper, would then be removed in an etching step with a suitable etchant, such as an acid. A thin Sn layer could also be used as the etching mask for the copper foil (the Sn first patterned with a photolith process)—in which case the Sn could remain on the pad in place of the ENIG 15.

FIG. 2G further shows where IMC 112 can comprise one or more of a core, a glass fiber woven material or core, layers of glass fiber, a glass reinforced epoxy material such as FR4, CEM, plastic, polymer, mold compound such as epoxy or a thermoset material, a printed circuit board (PCB) with or without routing, a PCB core, glass, metal, ceramic, silicon, fiberboard (for example cardboard), layers of paper laminated with epoxy or phenolic resin, carbon fiber, composite, or other suitable material. As used herein FR4 further comprises any suitable Flame Retardant PCB material such as FR1, FR2 or FR3; and similarly, CEM further comprises comprise CEM1, CEM2 or CEM3. The IMC 112 may have a thickness of from 300 to 1000 μm, or from 400 to 800 μm, dependent upon IMC 112 size and structural support requirements. The intermediate carrier 112 comprises a backside 116 disposed on an opposite side to the component mount site 13.

FIG. 2H is similar to FIG. 2F, but FIG. 2G differs from FIG. 2F in that FIG. 2G does not include a thermal frame. FIG. 2H illustrates a plan or top view of component mount site 13 comprising solder mask 19 and a thermal frame 17 as part of the component mount site 13, the mount site shown as having a component 14 mounted in a face up configuration showing conductive studs 125 disposed thereon. The thermal frame 17 is a good thermal conductor and may comprise one or more layers of metal, including: copper, aluminum, nickel, or titanium. In particular embodiments, the thermal frame 17 may comprise copper provided in sheets or foils pre-laminated to an insulating material, or formed by an electrodeposition process as known in the art. In some instances, the thermal frame 17 will be defined during patterning-such that both the thermal frame 17 and die pad 15 are defined at the same time and etched from the conductive material, such as the copper clad material mentioned previously. The thermal frame 17 may be disposed around a perimeter of the component mount site 13. In some embodiments, the thermal frame 17 may contact component pad 15 and provide thermal coupling and thermal dissipation to component 14. Component 14 comprises edge lengths 42 around the component mount site 13, as shown in FIG. 2H.

As shown in FIG. 3A, mounting of the plurality of components 14 to the intermediate carriers 112 may be accomplished by coupling the components 14 to the intermediate carriers 112 by way of component mount site 13 with an attachment material 50 disposed thereon. In one embodiment, the attachment material 50 may comprise an adhesive film or tape, a thermal release tape or material, or a UV release tape or material.

In an alternate embodiment as shown in FIG. 3B a paste adhesive 51 may be used, such as a standard die attach filled epoxy paste, other paste adhesive, that is disposed across component mount site 13, between the components 14 and the intermediate carrier 112. In instances where the intermediate carrier 112 will later be ground off, or the intermediate carrier 112 is metal and is left in the final part for electrical or thermal purposes—the attachment material 50 or paste adhesive 51 need not be a releasable material. When the intermediate carrier 112 remains as part of the final electronic assembly 150, a permanent and conductive attachment material may be used. In some embodiments, the intermediate carriers 112 comprise an edge length 114 in a range of 35-300 mm.

In some embodiments, the one or more intermediate carriers 112 may comprise interposers 115 with electrical routing, wherein the electrical routing is disposed at one or more of the following locations: within the interposer, on an upper surface of the interposer, on a lower surface of the interposer, and on a surface of the interposer. In other embodiments, the plurality of intermediate carriers 112 are not interposers 115 and do not comprise electrical routing.

FIG. 3C illustrates attachment of intermediate carriers 112 comprising a plurality of components 14 to the temporary carrier 110. Some intermediate carriers 112 or strips can have edge lengths 114 of 80 to 100 mm×280 to 300 mm, and may be mounted to temporary carrier 110 for subsequent molding. The intermediate carriers 112 may be mounted to the temporary carrier 110 with an adhesive layer 52, such as a die attach layer or a thermal release layer on a temporary carrier 110 comprising a metal carrier, or may be mounted with some other form of mechanical, chemical, atomic, magnetic, electrical, or other suitable bonding.

FIG. 3D illustrates a non-limiting example in which the intermediate carrier 112 is mounted to the release layer 52, and temporary carrier 110; however, any of the other substance and methods presented may also be used.

FIG. 3E illustrates a plurality of intermediate carriers 112, comprising two or more different components (shown as components 14a and 14b), each having a footprint 40 and edge length 42, mounted to the temporary carrier 110. The temporary carrier 110 may comprise a diagonal 120b in the ranges as aforementioned and can accommodate strips or intermediate carriers 112 of different sizes that are precisely positioned in close proximity to each other, or to allow space between the strips or intermediate carriers 112. In some embodiments, the strips or intermediate carriers 112 are of uniform size. In other embodiments, more than one size of strip or intermediate carrier 112 may be mounted on the temporary carrier 110. FIG. 3E further shows an area (represented by a dashed rectangle) where the IMC 112 may be later singulated into electronic assemblies 150 comprising two or more different components, depicted in one embodiment as 14a and 14b and further shown in FIG. 3Q, although other combinations which may vary in component size, type and number, are possible.

FIG. 3F illustrates a temporary carrier 110 that comprises a plurality of intermediate carriers 112 mounted thereto. In this illustration, the temporary carrier 110 is populated to capacity with intermediate carriers 112, each of which is also populated to its respective capacity with components 14. The temporary carrier 110 is sufficiently sized to include spaces or gaps between each of the intermediate carriers 112. A single intermediate carrier 112 may comprise from 30,000 to 52,000 components, or about 51,000 components, dependent upon component 14 edge length 42, and IMC 112 edge length 114. Thus, temporary carrier 110 may hold at least 60,000 to 104,000 components, or about 102,000 components, during assembly, dependent upon the diameter, diagonal, or edge length 120 of the temporary carrier 110.

In some embodiments, the temporary carrier 110 may be reusable rather than sacrificial, and after the temporary carrier 110 has been removed, it may be reused. The large reusable carriers may comprise metal, glass, ceramic, or other suitable material.

FIGS. 3G and 3H illustrate molding of the IMCs 112, comprising a plurality of components 14, over two embodiments of temporary carriers 110 to form a reconstituted panel 134, over which a fan-out or fan-in build-up interconnect structure 154 may be formed. In some instances, the temporary carrier 110 may be removed after disposing an encapsulant 130 over the one or more intermediate carriers 112, and in other instances, the encapsulating may occur without using the temporary carrier 110, such that the one or more intermediate carriers 112 are put directly into the mold or mold chase 160, as shown and described in FIGS. 7A-7D. In some embodiments, the fan-out build-up interconnect structure 154 may comprise a molded direct contact interconnect structure 155, as shown, e.g., in FIG. 3Q.

As illustrated in subsequent FIGS. 3O to 3R, the temporary carrier 110 may be removed after the molding processes, and in some instances removal of the temporary carrier 110 may be facilitated by a release layer 52, such as a die attach tape or a thermal release layer. In some embodiments as shown in FIGS. 3G and 3H, the reconstituted panel 134 may comprise an edge length similar to that of the temporary carrier 110, in a range of 300 mm to 1000 mm and may comprise a footprint or form factor, that is circular, partially circular (such as a circle with flattened portions), a rectangle, a square, or any other suitable geometric or organic shape.

FIG. 3I illustrates a side view taken along the cross-sectional line 3I as shown in the plan view of FIG. 3G. FIG. 3I illustrates a side view after molding the intermediate carrier 112 and the plurality of components 14, as disposed over the temporary carrier 110, with an encapsulant 130, to a height $T_1$. In particular embodiments, the temporary carrier 110 may comprise a metal carrier. As shown, the encapsulant 130 may be disposed around four side surfaces of each of the plurality of components, over the front surface 21 of each of the plurality of components and contact at least a portion of the sides 126 of the conductive studs 125. The encapsulant 130 may also be disposed around, and directly contact, four or more side surfaces of the one or more intermediate carriers 112.

The encapsulant 130 may comprise a polymer composite material, such as epoxy resin with filler commonly referred to as epoxy molding compound, or EMC, epoxy acrylate with filler, ABF (Ajinomoto Build-up Film®), or other polymer with proper filler. The encapsulant 130 may in other embodiments comprise a flowable or non-flowable encapsulant or mold compound. For example, the encapsulant 130 may comprise an EMC comprising a low elastic modulus, which could benefit from retaining the intermediate carrier 112 in the final electronic assembly 150 for increased strength and rigidity.

In some embodiments, the temporary carrier 110 and release layer 52 are removed after disposing an encapsulant 130 over the plurality of intermediate carriers 112, as shown in FIG. 3J.

FIG. 3J, continuing from FIG. 3I, illustrates a cross-sectional side view of the reconstituted panel 134 after debond (or removal) of the temporary carrier 110.

FIG. 3K, continuing from FIG. 3J, illustrates a side view after optional warpage compensation material 54 (backside laminate) is placed. As shown in FIG. 3K, the warpage compensation material 54 is applied to a backside 116 of the intermediate carriers 112 and the encapsulant 130 after removing the temporary carrier 110 and release tape 52 from the reconstituted panel 134. The warpage compensation material 54 (backside laminate) may comprise one or more layers of a material that has similar mechanical properties as, or is the same or similar to, the encapsulant 130 or mold compound, such as an epoxy composite material. Using a backside compensation material 54 having properties similar to encapsulant 130 provides similar coefficient of thermal expansion values over a temperature range to that of encapsulant 130, thus preventing warpage or bending of the reconstituted panel 134 during processing.

FIG. 3L, continuing from FIG. 3K, illustrates a side view after a front or top side thinning to reduce the thickness of the reconstituted panel 134 to a thickness, $T_2$. A portion of the encapsulant 130 disposed over the front surface 21 of the plurality of components 14 may be removed through a thinning process (such as by grinding, a diamond cutting process, or other suitable method or process) to thin the reconstituted panel 134 and to expose ends 128 of the conductive studs 125.

The front or top side thinning to remove a portion of the encapsulant 130 may form a substantially planar surface 132 above the front surface 21 of the plurality of components 14. In certain embodiments, the substantially planar surface 132 comprises a roughness less than 500 nanometers (nm) over a characteristic measurement distance. The substantially planar surface 132 may comprise ends 128 or exposed ends of the conductive studs 125 and a planar surface 133 of the encapsulant 130. The planar surface 133 of the encapsulant 130 as part of the reconstituted panel 134 may comprise a roughness less than 500 nanometers (nm) over a characteristic measurement distance. The characteristic measurement distance is defined by the ISO 4288 standard, an entirety of which is hereby incorporated by reference. The characteristic measurement distance may also be a distance great enough to characterize the roughness, such as to a generally accepted level of certainty, and in some instances could be a distance of three times the distance of the roughness. While conventional encapsulant grinding might be done with less flatness, greater accuracy and precision can be obtained by using integrated sensors such as laser, acoustic, or other non-contact methods to control the grinding resulting in better flatness.

The conductive studs 125 exposed at the planar surface 132 may undergo an etching process with the rest of the planar surface 132 to remove metallic or copper residue that results from the thinning process. As a result, the ends 128 of the conductive studs 125 may comprise a recess 128a with respect to the planar surface 132 at a distance of, or about, 1-1,000 nm. As used herein, "about" or "substantially" means a percent difference less than or equal to 50% difference, 40% difference, 30% difference, 20% difference, 10% difference, or 5% difference.

FIG. 3M, continuing from FIG. 3L, illustrates forming a fan-out build-up interconnect structure 154 over the planar surface 132 of the reconstituted panel 134. In other embodiments, a molded direct interconnect structure 155, as shown in FIG. 3Q, may be formed over the reconstituted panel 134. In other embodiments the build-up interconnect structure could be a fan-in interconnect structure. FIG. 3M further illustrates external or package interconnect pads 136 comprising one or more lands, balls, leads, pins, and external interconnects 140 disposed thereon. Although depicted here for FIG. 3M, a person of ordinary skill in the art (POSA) would understand that package interconnect pads 136 and external interconnects 140, whether individually or in combination, could be included in a similar manner for all embodiments of assemblies 150 as disclosed herein.

FIG. 3N, continuing from FIG. 3M, illustrates singulating the plurality of components 14 from the reconstituted panel 134 and through the intermediate carrier 112, when present, using a saw or wafer cutting tool 32 to form the plurality of semiconductor assemblies or fan-out semiconductor assemblies 150. The warpage compensation material 54 provides support during singulation if necessary, dependent upon the thickness of the intermediate carrier 112, and the materials comprising it.

The intermediate carrier 112 may be advantageously incorporated into the final assembly 150 as shown in FIG. 3N such as when the intermediate carrier 112 comprises metal or other conductive or suitable material that provides some structural, thermal or electrical benefit. The fan-out build-up interconnect structure 154 may comprise solder balls or bumps, as shown in FIG. 3N, or may comprise package interconnect pads 136 comprising land grid arrays (LGAs) without solder bumps, as shown in FIG. 3O (with temporary carrier 122 attached).

FIG. 3O, continuing from FIG. 3M, illustrates that in some instances, prior to attachment of external interconnects 140, the intermediate carrier 112, backside laminate or warpage compensation material 54, or both, may be removed from the reconstituted panel 134, such as by a grinding process using grinding tool 29, to thin the reconstituted panel 134 and expose backsides 18 of the plurality of components 14. In order to facilitate the grinding or thinning, a temporary carrier 122, such as a metal carrier attached by release tape 123 comprising thermal release tape, or a temporary carrier 122 comprising a glass carrier with release tape 123 comprising a UV release material, or other suitable carrier may be used to support the reconstituted panel 134 and the plurality of components 14 during thinning.

FIG. 3P, similar to FIG. 3O, illustrates another instance in which the temporary carrier 122, release tape 123, intermediate carrier 112, and a portion of conductive material 15, 30 from the reconstituted panel 134 are removed. In some instances, conductive layer 15b may remain attached to the backside 18 of the components 14, and some or all of the conductive layer 15a may be removed from the backside 18 of the component 14 and from the conductive layer 15b. Further, as described with respect to FIG. 3O, the reconstituted panel 134 may be singulated to form a plurality of semiconductor assemblies 150 comprising the fan-out or fan-in build-up interconnect structure 154.

FIG. 3Q also depicts where an optional backside material 30 has been disposed over backsides 18 of the components 14 to enhance thermal performance of the assemblies 150 and optionally provide for later thermal coupling to another structure such as a heat sink, a cold plate and similar structures to dissipate heat generated by components 14. As shown in FIG. 3P, in some embodiments, backsides 18 may comprise the backside material 30 extending beyond the edges 24 of the components 14. In other embodiments, backside material 30 may be flush with the edges 24 of the components 14, and the entire backside 18 may be covered by the backside material 30. In further embodiments, backside material 30 may be set back from the edges 24 of the components 14 and only a portion of backside 18 is covered by the backside material 30. A POSA will appreciate that any desirable configuration for backside material 30 may be implemented, including a pre-applied backside material (applied as part of the wafer fabrication process), or additional layers of backside material 30 may be applied.

FIG. 3Q also depicts singulating the reconstituted panel 134 to form semiconductor assemblies 150 comprising multiple components 14a and 14b. While two components are depicted, components 14 may be of any size, and any number of components may be included in the semiconductor assembly 150. FIG. 3Q further illustrates where the build-up interconnect structure 154 from FIG. 3P comprises a molded direct contact interconnect structure 155 (also known under the trademark "MDx" ™). The molded direct contact interconnect structure 155 may comprise one or more dielectric materials or layers of dielectric materials of the build-up interconnect structure 154 which are instead formed of encapsulant 130a which may comprise the same or different material as encapsulant 130. Molded direct contact interconnect structures 155 (and a method for making and using the same) are discussed in U.S. patent application Ser. No. 18/195,090, and issued on Apr. 30, 2024 as U.S. Pat. No. 11,973,051, the entirety of which is hereby incorporated herein by reference. Additionally, the molded direct contact interconnect structure 155 can be made or used as described in: (i) USP application Ser. No. 17/957,683, filed Sep. 30, 2022, titled "Quad Flat No-Lead (QFN) Package Without Leadframe and Direct Contact Interconnect Build-Up Structure;" and (ii) USP App. No. 63/480,094, filed Jan. 16, 2022, titled "Stacked Molded Direct Contact and Dielectric Structure and Method for Making the Same;" both of which are hereby incorporated by reference in their entireties.

Molded direct contact interconnect structures 155 may comprise or provide: (i) large area chip bond pad interconnect to create a very low contact resistance, (ii) removal of capture pads between build-up layers, such as traces, (iii) cost savings by removing polyimide and other polymers from dielectric layers comprising the fan-out build-up interconnect structure 154, using encapsulant 130, 130a instead, and (iv) facilitate ultra-high-density connections such as 20 micrometer bond pitch and smaller. As further shown in FIG. 3Q, the semiconductor assemblies 150 may comprise an optional backside materials, 15, 30 disposed on backside 18 of components 14 for enhanced thermal management as previously discussed. The optional backside materials, 15, 30 may be level, flat, or substantially coplanar with an upper or outer surface of the encapsulant 130. In other embodiments, the optional backside material 30 may disposed over backsides 18 of both components 14a and 14b of FIG. 3Q. In some embodiments, the fan out interconnect structure 80 (shown in FIGS. 4F and 4G), as part of the build-up interconnect structure 154 or the molded direct contact interconnect structure 155, may electrically couple two or more components, such as components 14a and 14b, as shown in FIG. 3Q.

Figure 3R:
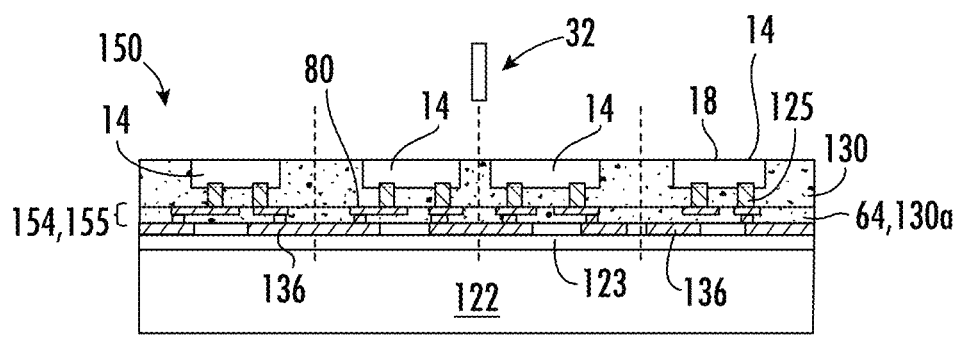

FIG. 3R illustrates another optional version of assembly 150 comprising one RDL within the build-up interconnect 154, 155, and with package interconnect pads 136 formed for package input output (IO) without solder balls. The interconnect pads may further comprise a solderable metal surface (SMS) or an organic solderability preservative (OSP) disposed thereon or therearound. In some instances, an anisotropic conductive paste (ACP), or anisotropic conductive film (ACF) material may be applied to a PCB or substrate during the assembly of the package to the PCB or substrate.

Figure 3S:
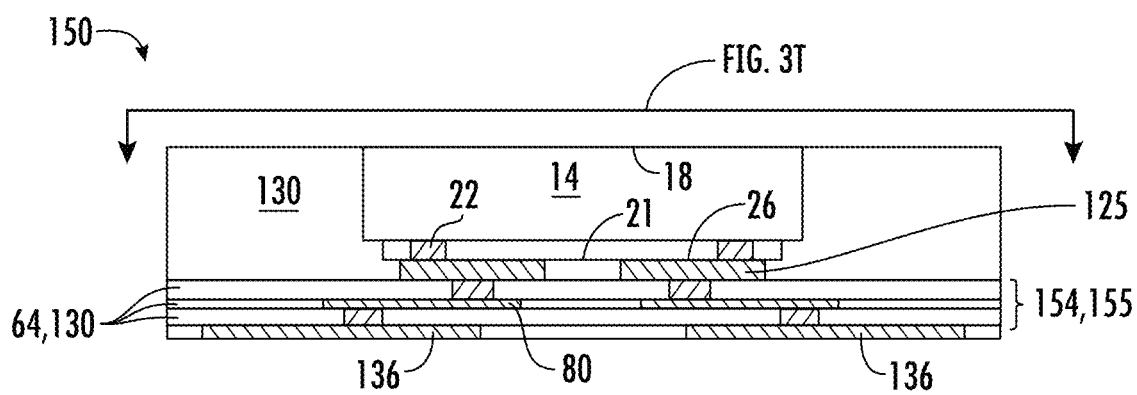
Figure 3T:
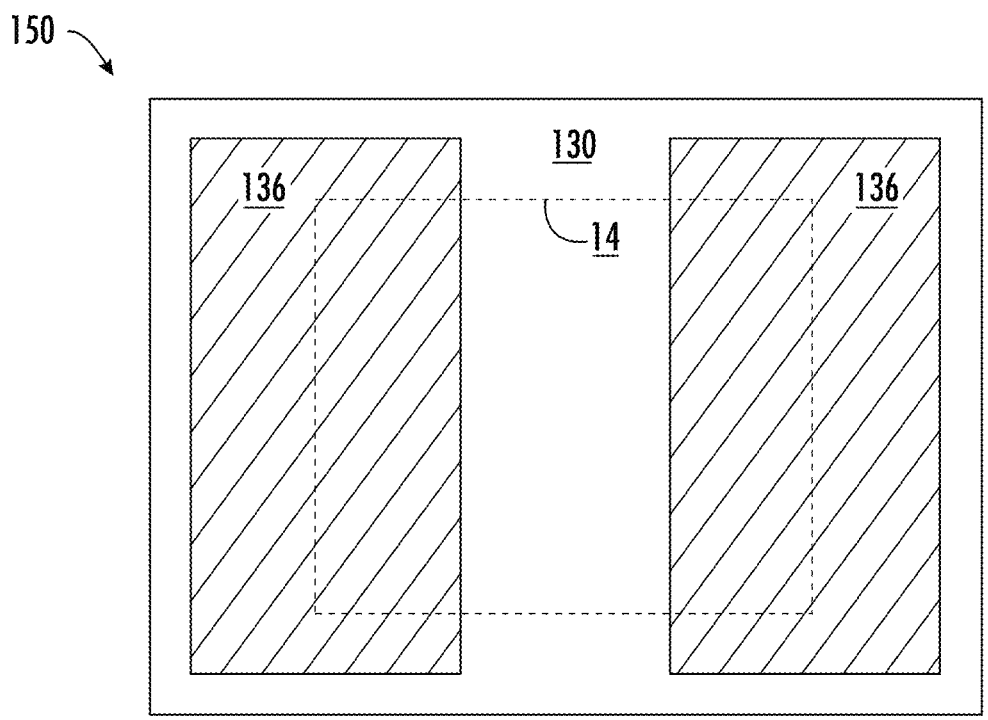

FIGS. 3S and 3T illustrate another optional version of assembly 150, in which the assembly 150 comprises a two-terminal device with two land pads 136 that may be coupled to an antenna and may be advantageously used with RF devices or RFID tags, for tracking merchandise, such as clothes, or other articles, such as airline passenger luggage. A plan view is shown in FIG. 3T, and cross-sectional side view is shown in FIG. 3S.

In other instances, the assembly 150 may comprise 8-10 leads, and be used with components 14 that comprise microcontrollers, such as with chips in smartcards, credit cards, and debit cards. In yet other instances (more similar to what is shown in FIGS. 3P and 3Q), assembly 150 may be much larger (comprising a die on the order of about 4 mm by 10 mm or comprising a die comprising side lengths on the order of about 25 mm, or a reticle size and in other instances with bridge die (not limited by reticle size), can be greater than, even larger than, side lengths of 25 mm and of any desired size) and comprise a plurality of RDL layers (such as about 9 or more separate conductive layers) within the build-up interconnect structure 154, 155 that are coupled with thousands of IO contacts, contact pads 136, or bumps 140.

In yet other instances, such as when the assembly 150 comprises a bridge die 14, the assembly 150 may be formed using one or more of unit-specific patterning (also known under the trademark Adaptive Patterning™) or RDL repair, so as to accommodate design changes. One such design change may result from the formation and testing of a high bandwidth memory (HBM) stack, which after testing, has been configured to a new design to compensate for defects. The new design or a change to the HBM IO signal locations can require—or call for—routing changes in the assembly 150, which can be accommodated using one or more of unit-specific patterning or RDL repair. In addition to HBM, MCM, or any other suitable structure, device, or assembly may also be changed or reconfigured to account for, or accommodate, defects or for other purposes. In these situations, the new design or a change to the MCM or other structure may have its IO signal locations changed, which require—or call for—corresponding routing changes in the assembly 150, which can be accommodated using one or more of unit-specific patterning or RDL repair.

FIGS. 4A-4H, continuing from FIG. 2E, illustrate another process flow, similar to the process flows shown in FIGS. 3A-3T for a method of making a plurality of semiconductor assemblies 150, comprising mounting a plurality of components 14 to an intermediate carrier 112 before mounting the plurality of components 14 to a temporary carrier 110 for molding and packaging. Similar elements and features in FIGS. 4A-4H may be the same or similar with those elements and features shown in FIGS. 3A-3T, but for brevity, may not repeat all the detail previously provided.

Figure 4A:
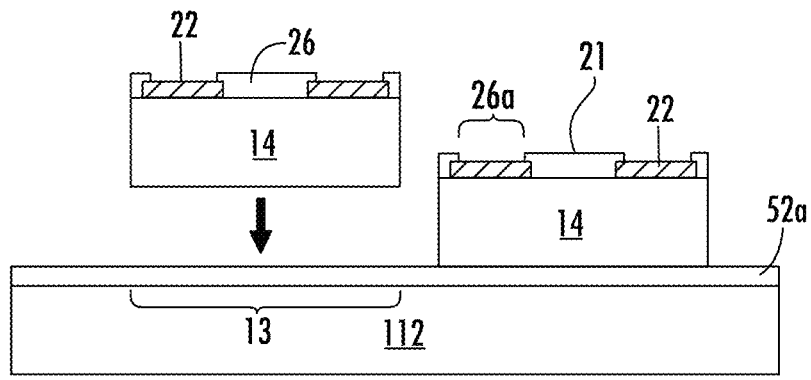
FIGS. 4A-4H illustrate another method for the formation of assemblies using intermediate carriers disposed on temporary carriers according to the methods as disclosed herein.

FIG. 4A illustrates the plurality of components 14 may be formed without conductive studs 125, such as without copper studs. The plurality of components 14 may comprise conductive pads or contact pads 22 over an active layer 20 of the component. The contact pads 22 may have little offset or difference in height from the active layer 20 of the component. In one embodiment, at least a portion of the contact pads 22 may be covered by an overlying insulating layer 26 with holes or apertures 26a in the insulating layer 26 to expose the contact pads 22, such that the contact pads 22 lie below a front surface 21 comprising the insulating layer 26. According to the process flow of FIG. 4A, the plurality of components 14 may be mounted over component mount site 13 face up on the intermediate carrier 112 using a release layer 52. The release layer 52 may comprise a first release layer 52a (as shown in FIG. 4A), comprising a first thermal release layer that releases at a first temperature.

Figure 4B:
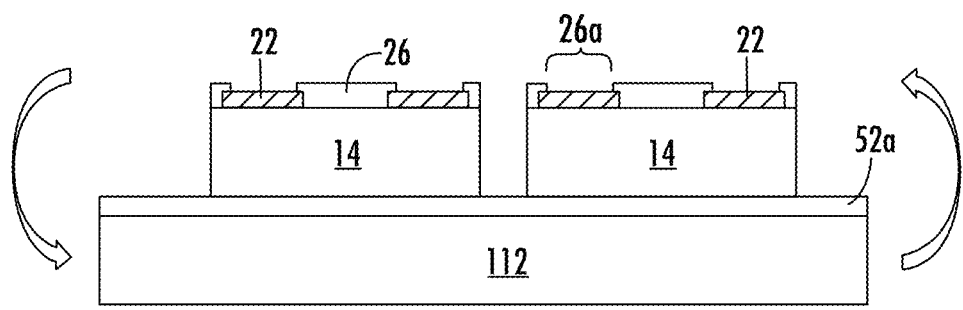

FIG. 4B, continuing from FIG. 4A, illustrates the plurality of components 14 attached to the intermediate carrier 112 via the first release layer 52a. After the components 14 (without conductive studs 125) are mounted face-up to the intermediate carrier 112, the intermediate carrier 112 may be flipped so as to mount the intermediate carrier 112 and plurality of components 14 face down over the temporary carrier 110, as subsequently illustrated in FIG. 4C.

Figure 4C:
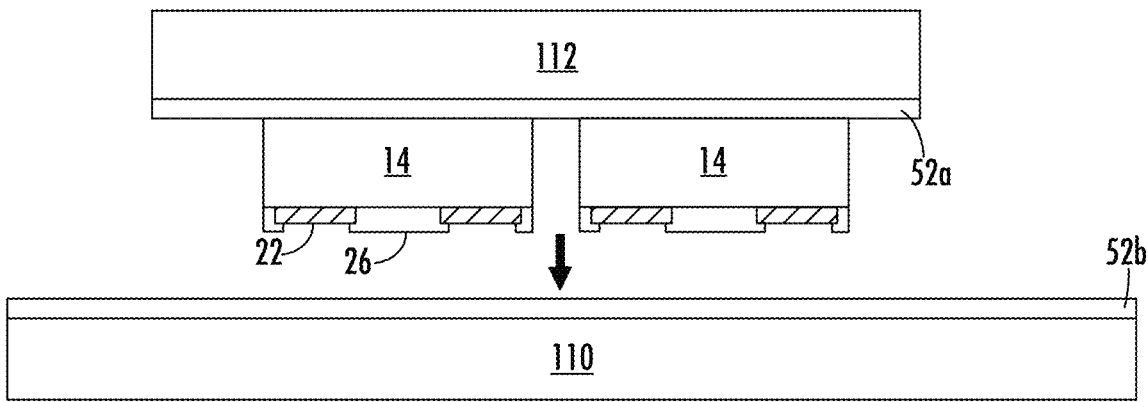

FIG. 4C, continuing from FIG. 4B, illustrates that the intermediate carrier 112 comprising a plurality of components 14 can be attached to the temporary carrier 110 using second release layer 52b. Second release layer 52b may comprise a second thermal release layer that releases at a second temperature that is greater than the first temperature of first release layer 52a. In the illustration, the intermediate carrier 112 is positioned such that the front surface 21, comprising insulating layer 26, of the components 14 contact the release layer 52b In other embodiments, the first release layer 52a and second release layer 52b may differ in their adhesive properties, rather than their thermal release properties, and may be selected accordingly. As such, the first release layer 52a and second release layer 52b may be chosen such that adhesion between the front surface 21 of the components 14 and the temporary carrier 110 is greater than the adhesion between backsides 18 of components 14 and the intermediate carrier 112, thus allowing for removal of the intermediate carrier 112 as shown in FIG. 4D based upon adhesive properties of the first release layer 52a and second release layer 52b.

Figure 4D:
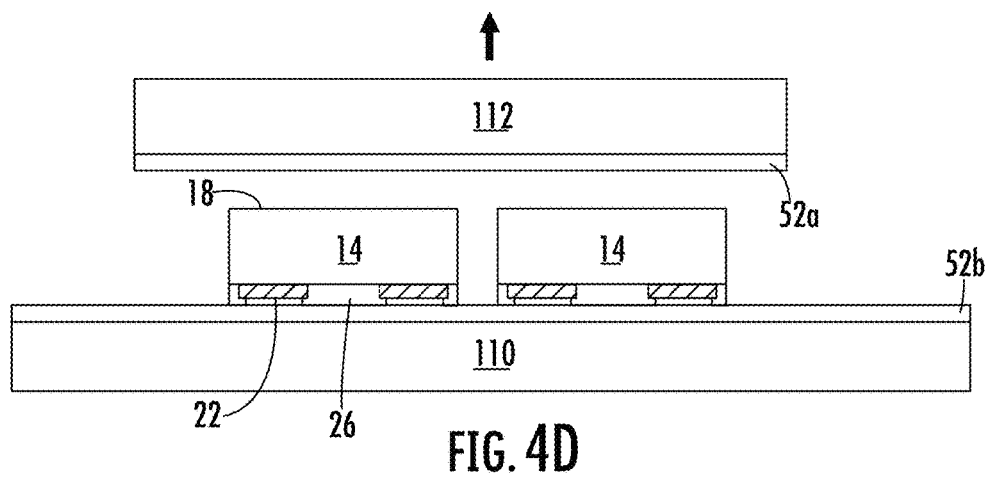

FIG. 4D, continuing from FIG. 4C, illustrates that in some instances the intermediate carrier 112 and first release layer 52a can be removed from the components 14 which remain attached to the larger carrier 110.

Figure 4E:
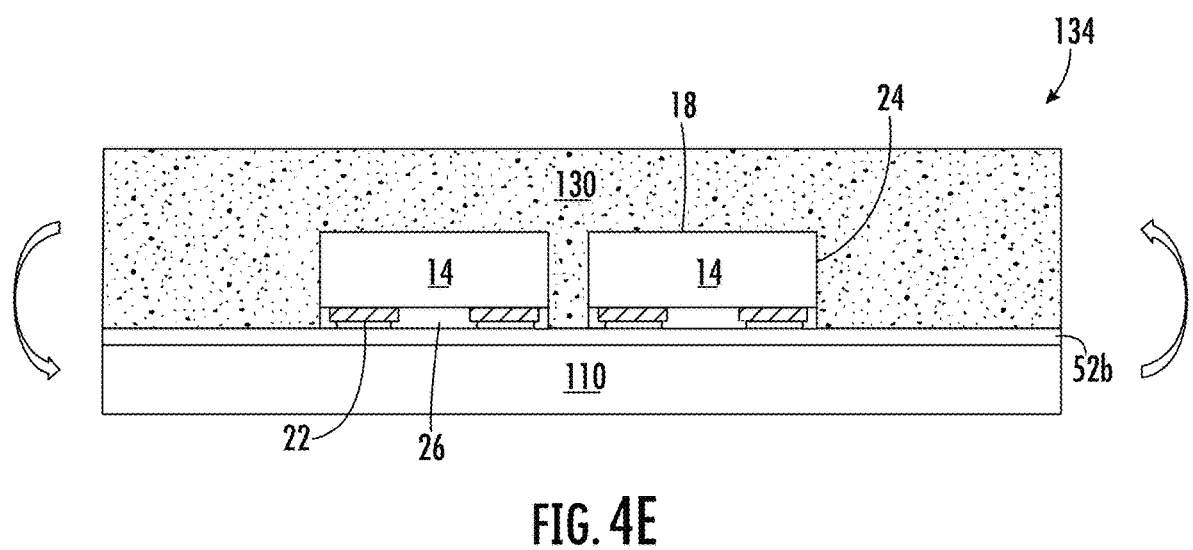

FIG. 4E, continuing from FIG. 4D, illustrates disposing an encapsulant 130 over the plurality of components 14 (that were previously mounted to a plurality of intermediate carriers 112) and that remain mounted to the temporary carrier 110 at the time of encapsulation so as to form a reconstituted panel 134. The encapsulant 130 may be disposed around four side surfaces of each of the plurality of components 14, and may also be disposed over a backside 18 of the plurality of components 14 while the components are mounted face down to the temporary carrier 110. The conductive pads or contact pads 22 of the plurality of components 14 may be compressed or disposed partially, mostly, or entirely within the second release layer 52b used to couple the plurality of components 14 to the temporary carrier 110 (when the contact pads are formed as bumps or layers that protrude from the surface as may be the case when contact pads 22 are not covered by insulating layer 26). When the contact pads do not protrude, such as when they are recessed below (and exposed with respect to) the insulating layer 26 as depicted in FIG. 4E, the insulating layer 26 of the component 14 may be slightly depressed within, and will seal with, the second release layer 52b. As used herein, slightly depressed means about 1-10 μm. After molding or encapsulating to form the reconstituted panel 134, the reconstituted panel 134 may be flipped over and the large carrier 110 removed to facilitate the subsequent formation of a fan-out build-up interconnect structure 154 over the components 14 and over the encapsulant 130 as shown in FIG. 4F following.

Figure 4F:
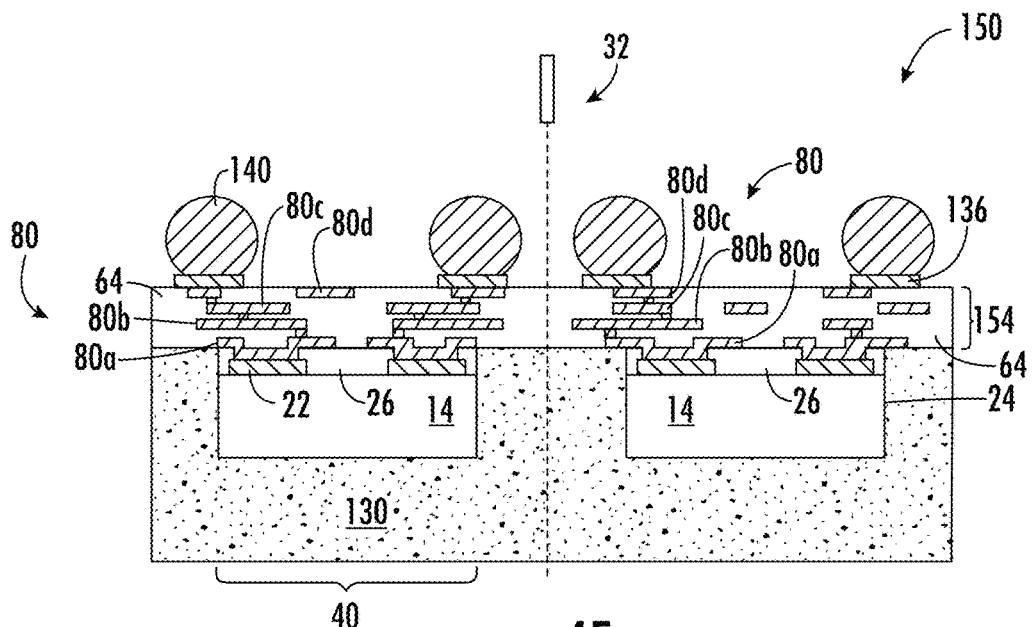

FIG. 4F, continuing from FIG. 4E, illustrates that after the removal of the temporary carrier 110, the reconstituted panel 134 may have a build-up interconnect structure, or fan-out build-up interconnect structure 154, formed over the plurality of components 14 and extending beyond an edge 24 of the component 14. The fan-out build-up interconnect structure 154 may comprise a fan-out interconnect structure 80 comprising conductive traces, vias, pads and other features. The fan-out interconnect structure 80 may be disposed over a footprint 40 of the components 14 as well as over the encapsulant 130 and coupled to component 14. As part of the fan-out interconnect structure 80, a conductive redistribution layer (RDL, and a first formed seed layer) 80a may be formed over at least a portion of the contact pads 22 and the insulating layer 26, and extending into the aperture 26a within insulating layer 26. The contact pads 22 may be coupled, both mechanically and electrically, to the conductive layer 80a. Additional routing layers 80b-80d are shown as part of the fan-out interconnect structure 80 for forming fanouts, vias, LGA pads, contact pads, as well as other features, and to allow connectivity from one conductive layer to another. FIG. 4F further illustrates external or package interconnect pads 136 comprising one or more lands, balls, leads, pins, and external interconnects 140 disposed thereon. The components 14 with the build-up structure 154 disposed thereon may then be singulated using a saw or wafer cutting tool 32 into individual assemblies or semiconductor assemblies 150. At least a portion of the conductive redistribution layer 80a may be formed using unit specific patterning, which is also known under the trademark "Adaptive Patterning"®. Unit specific patterning or adaptive patterning is described, e.g., in U.S. Pat. No. 9,196,509, the entirety of which is hereby incorporated by reference herein.

Figure 4G:
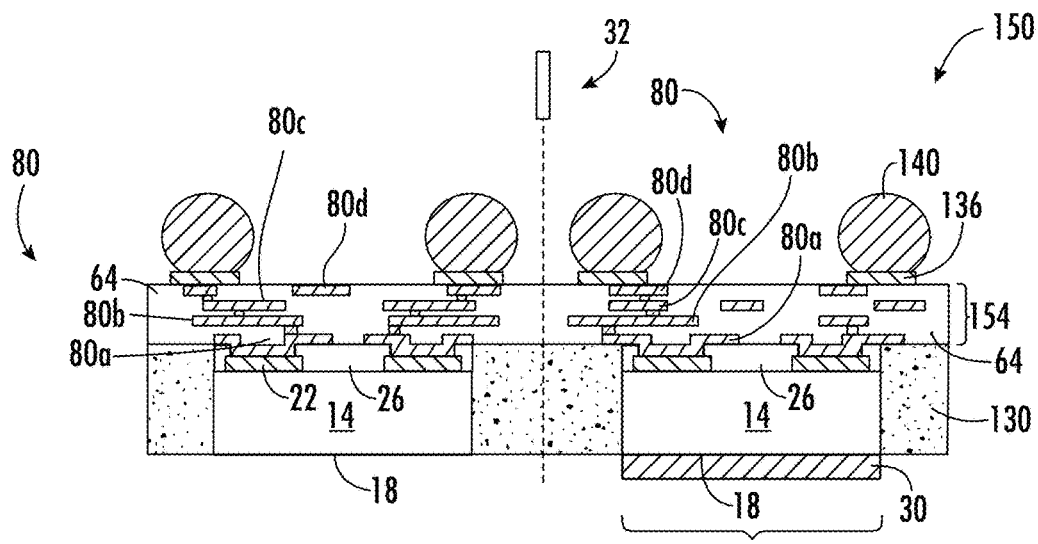

FIG. 4G, similar to FIG. 4F, illustrates that in some instances the back sides 18 of the components 14 may be exposed with respect to the encapsulant 130 or mold compound, whether by a grinding process, or by not covering the backside 18 during the encapsulating process. In some embodiments, backside 18 may have a backside material 30 disposed thereon to provide enhanced thermal performance as described previously.

Figure 4H:
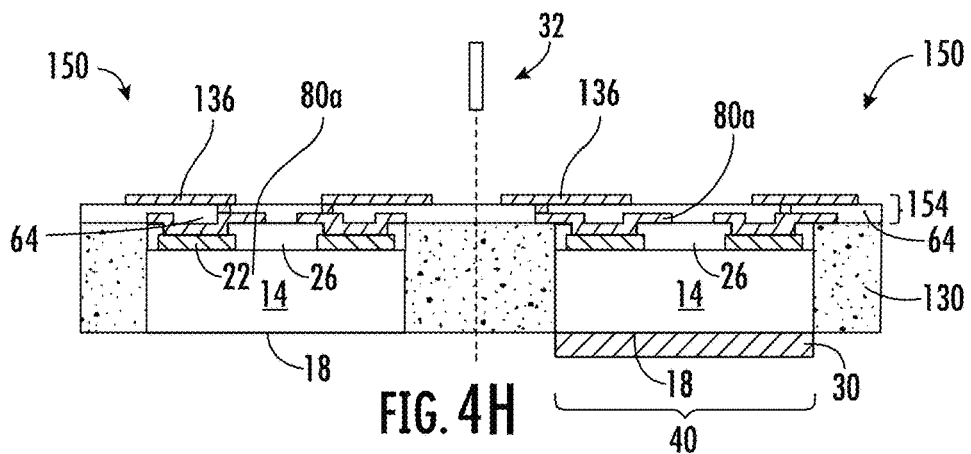

FIG. 4H, similar to FIG. 4G, illustrates an example of an assembly 150 with IO pads 136 and without bumps 140, including one conductive layer or one RDL layer 80a.

As noted above, the semiconductor assemblies 150 of FIGS. 4F and 4G, and the method outlined for making the same, may provide benefits and advantages that are the same or similar to what was described above with respect to FIGS. 3A-3Q.

FIGS. 5A-5H, continuing from FIG. 2E, illustrate another process flow, similar to the process flows shown in FIGS. 3A-3Q and FIGS. 4A-4H for a method of making a plurality of semiconductor assemblies 150, comprising mounting a plurality of components 14 to an intermediate carrier 112 before mounting the plurality of components 14 to a larger carrier 110 for molding and packaging. Similar elements and features in FIGS. 5A-5H may be the same or similar with those elements and features shown in FIGS. 3A-3T and 4A-4H, but for brevity, may not repeat all the detail previously provided.

Figure 5A:
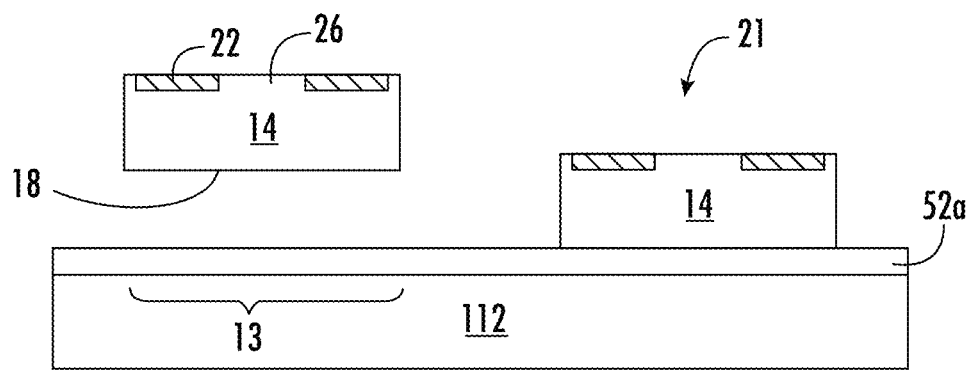
FIGS. 5A-5H illustrate a further method for the formation of assemblies using intermediate carriers disposed on temporary carriers according to the methods as disclosed herein.

FIG. 5A illustrates the plurality of components 14 being mounted face-up on the intermediate carrier 112 using the first release layer 52a as described with respect to FIG. 4A previously. Components 14 may comprise contact pads 22 which are substantially coplanar with, and forming at least a portion of, front surface 21 as depicted in FIGS. 1B and 1C.

Figure 5B:
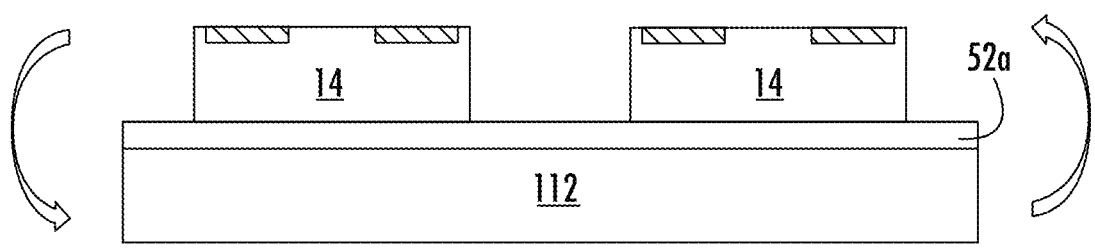

FIG. 5B, continuing from FIG. 5A, illustrates components 14 attached to the intermediate carrier 112 via the first release layer 52a. After the components 14 without conductive studs 125 are mounted face-up to the intermediate carrier 112, the intermediate carrier 112 may be flipped so as to mount the intermediate carrier 112 and plurality of components 14 face down over the temporary carrier 110, as subsequently illustrated in FIG. 5C.

Figure 5C:
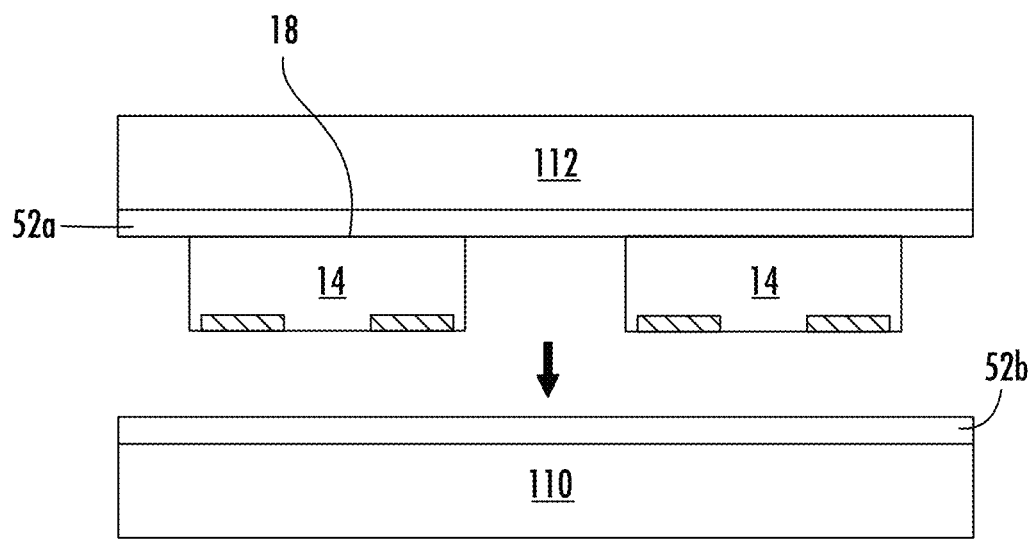

FIG. 5C, continuing from FIG. 5B and similar to FIG. 4C, shows attaching the intermediate carrier 112 comprising a plurality of components 14 to the temporary carrier 110 using second release layer 52b.

Figure 5D:
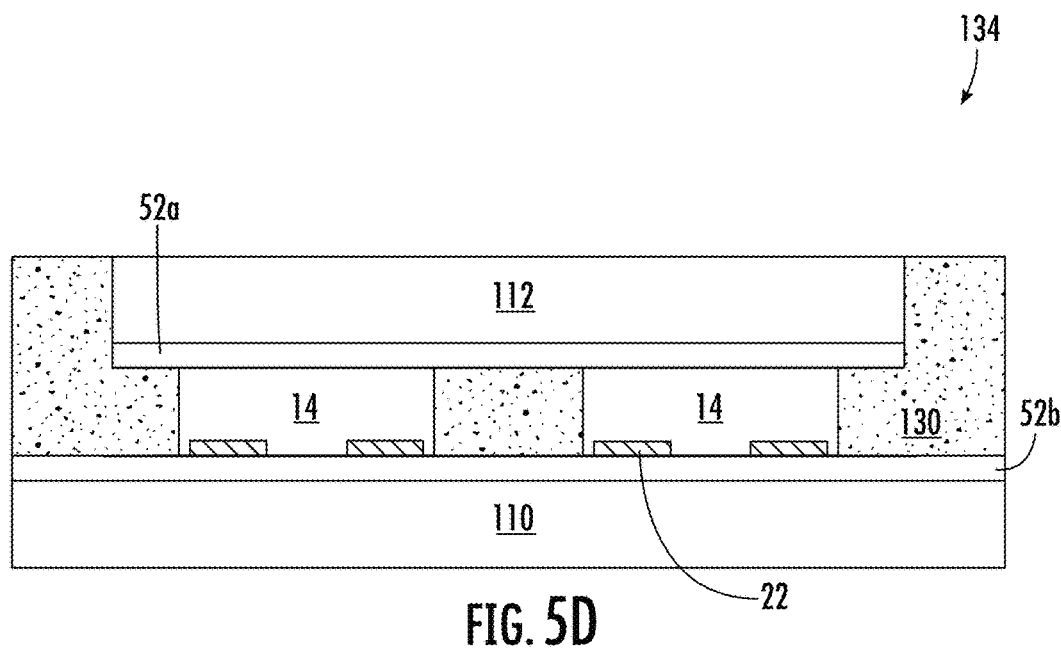

FIG. 5D, continuing from FIG. 5C, illustrates disposing an encapsulant 130 around the plurality of components 14 while they are still mounted to the plurality of intermediate carriers 112 and that remain mounted to the temporary carrier 110 at the time of encapsulation so as to form a reconstituted panel 134. The encapsulant 130 may be disposed around four side surfaces of each of the plurality of components 14 and may not be disposed over a backside 18 of the plurality of components 18 as the components 14 are mounted to the plurality of intermediate carriers 112. The encapsulant 130 may be disposed between the plurality of intermediate carriers 112 and the temporary carrier 110, which may be facilitated with an encapsulant 130 comprising a lower viscosity encapsulant than in instances when the plurality of the intermediate carriers 112 are not present. The lower viscosity encapsulant may be the same or similar to encapsulants or EMCs that are used for standard plastic packages like a Small Outline Integrated Circuit (SOIC), a Thin Quad Flat Package (TQFP), or other similar packages. The lower viscosity encapsulant may be disposed using a transfer molding process, or other suitable process.

Figure 5E:
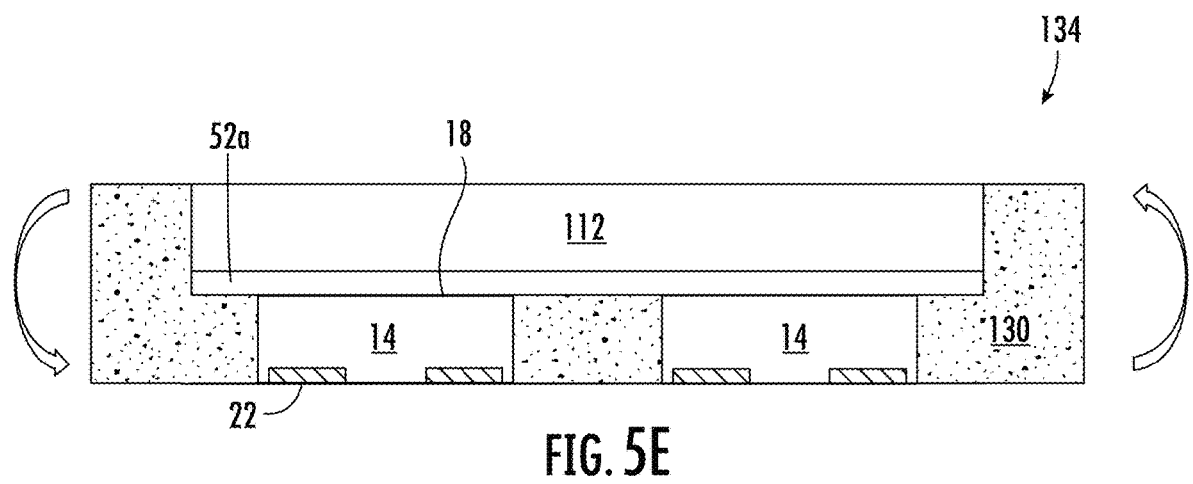

After molding or encapsulating to form the reconstituted panel 134 as illustrated in FIG. 5D, the reconstituted panel 134 may be flipped over and the temporary carrier 110 removed as shown in FIG. 5E, to facilitate the subsequent formation of a fan-out build-up interconnect structure 154 over the reconstituted panel 134, comprising the embedded components and the encapsulant 130.

Figure 5F:
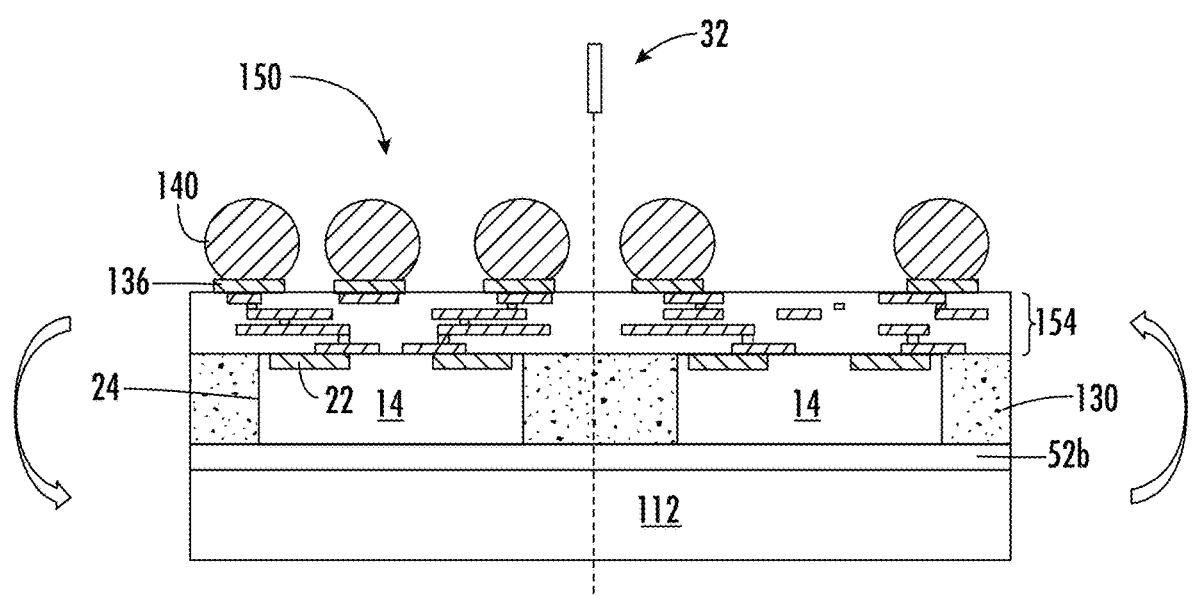

FIG. 5F, continuing from FIG. 5E, illustrates that after the removal of the temporary carrier 110, the reconstituted panel 134 may have a build-up interconnect structure, or fan-out build-up interconnect structure 154, formed over the plurality of components 14. The fan-out build-up interconnect structure 154 may also extend beyond an edge 24 of each of the plurality of components 14. The plurality of components 14 with the fan-out build-up interconnect structures 154 formed thereon may then be singulated as previously described into individual assemblies or semiconductor assemblies 150, which may include the intermediate carrier 112. The intermediate carrier 112, when part of the final assembly 150, may be thermally conductive, electrically conductive, or both, and provide additional assembly functionality, whether electrical or thermal. As in FIG. 3M, FIG. 5F also illustrates external or package interconnect pads 136 comprising one or more lands, balls, leads, pins, and external interconnects 140 disposed on the build-up interconnect structure 154.

Figure 5G:
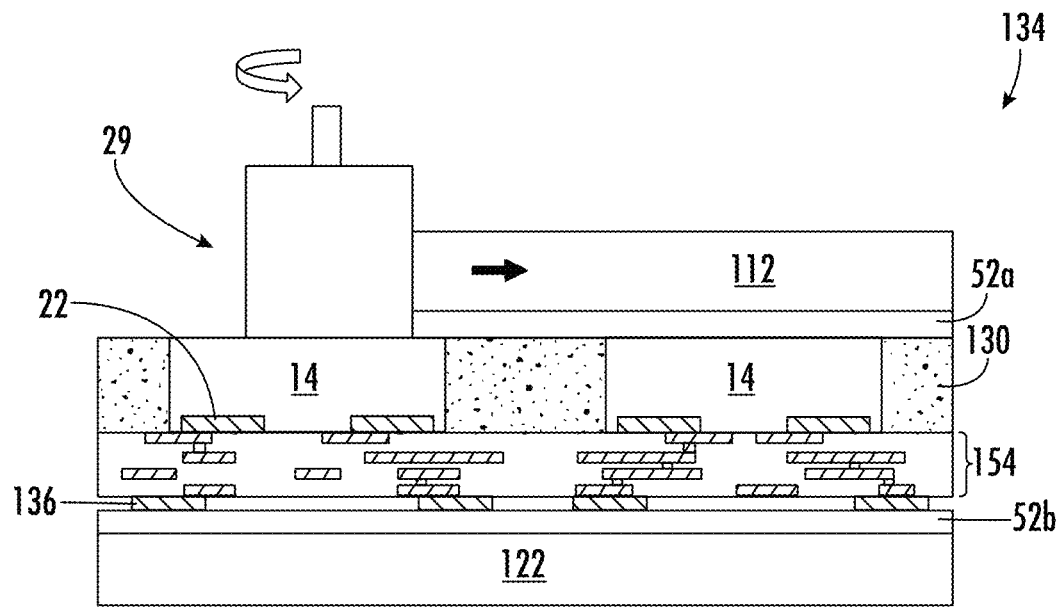
Figure 5H:
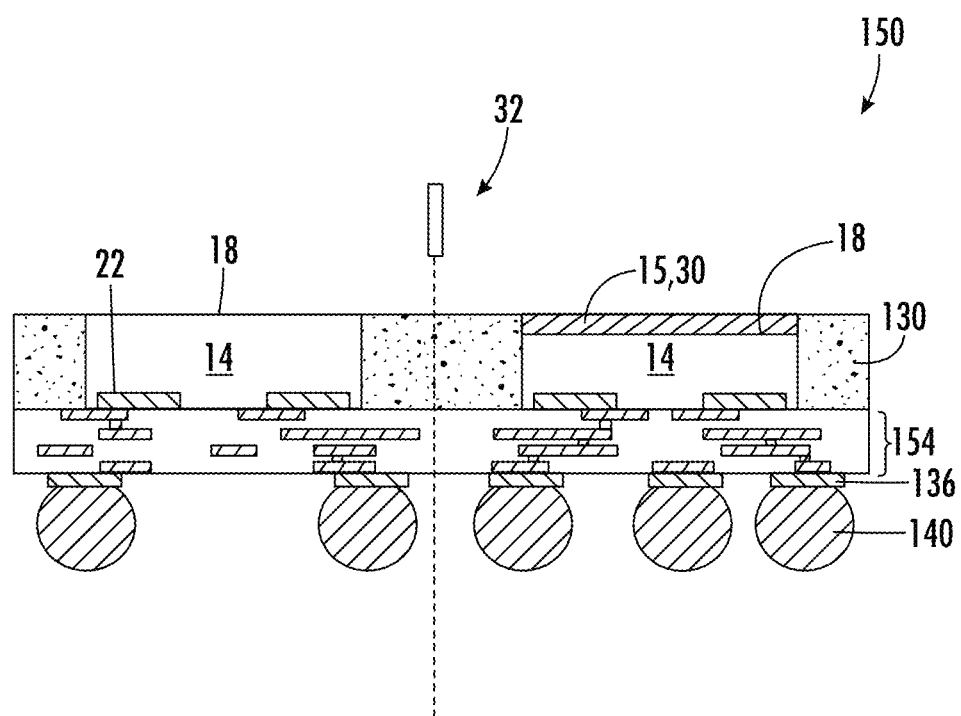

FIG. 5G, similar to FIGS. 3O and 4D, illustrates that in some instances, after the removal of the temporary carrier 110, the plurality of intermediate carriers 112 and release tape 52a may be removed, such as by a grinding process using grinder 29 or other suitable process. Removal of the plurality of intermediate carriers 112 may occur before or after formation of the fan-out build-up interconnect structure 154. Removal of the plurality of intermediate carriers 112 may also be facilitated by the use of a temporary carrier 122 attached with second release layer 52b, as shown in FIG. 5G.

FIG. 5, similar to FIG. 5F, illustrates that the plurality of components 14 with the fan-out build-up interconnect structures 154 formed thereon may then be singulated into individual assemblies or semiconductor assemblies 150, without the plurality of intermediate carriers 112. As shown, the grinding process of FIG. 5G may expose backsides 18 of the components 14 which may have a backside material 30 disposed thereon to provide thermal management to the assemblies or semiconductor assemblies 150 as previously described and with particular reference to FIGS. 3P and 3Q.

As noted above, the semiconductor assemblies 150 of FIGS. 5F and 5H, and the method outlined for making the same, may provide benefits and advantages that are the same or similar to what was described above with respect to FIGS. 3A-3Q and FIGS. 4A-4H.

Figure 6:
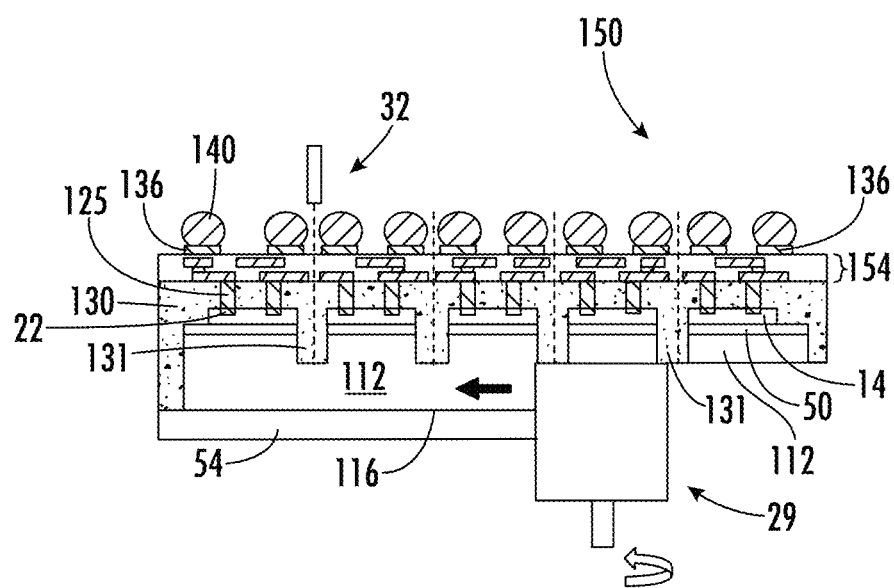
FIG. 6 shows a method for singulation of assemblies using an encapsulant filled trench.

FIG. 6, similar to FIGS. 3N and 3O combined, shows using a saw or wafer cutting tool 32 to form trench 131 into at least a portion of the intermediate carrier 112 between components 14 (or between multiple components 14 in the case of multi component assemblies) to a depth extending below backsides 18 of the components 14. The encapsulant 130 may then be disposed into trench 131 at a same time as the encapsulant 130 is disposed around the components 14. The warpage compensation material 54, and a portion of the intermediate carrier 112 and the encapsulant 130 may be removed from the reconstituted panel 134 by a grinding process which removes material from backside 116 of the intermediate carrier 112 to the depth to expose the encapsulant-filled trench 131. In some instances, exposing the encapsulant-filled trench 131 can be a grind stop or an indication to stop grinding.

Figure 7A:
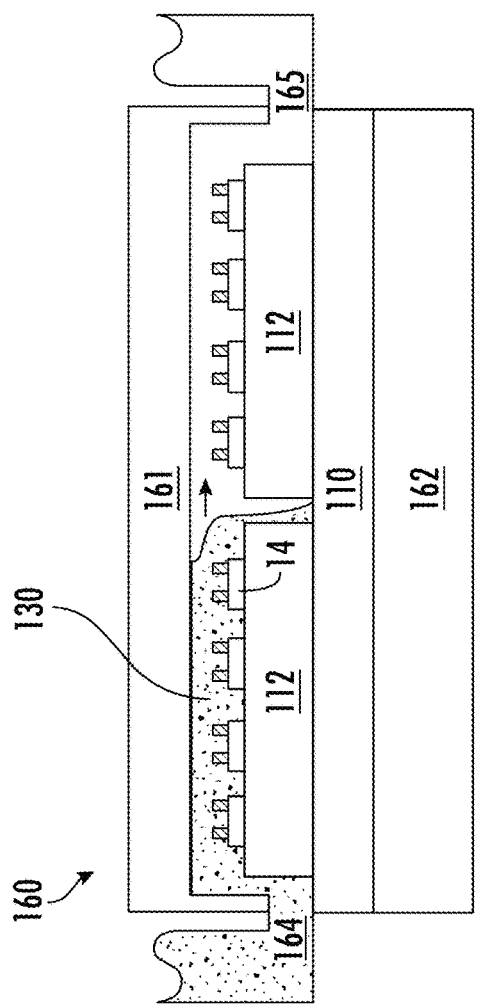

FIGS. 7A-7D illustrate various methods of encapsulating intermediate carriers 112 using a suitable process, such as molding. FIG. 7A illustrates a cross-sectional side view of a mold 160 comprising a top or upper mold 161 and a bottom or lower mold 162. The intermediate carriers 112 are mounted or disposed over the temporary carrier 110 and disposed within the mold 160 used with a suitable molding process, such as transfer molding, compression molding, and transfer molding. An injection port 164 on one or more sides of the mold allow for the encapsulant 160 to flow into the mold and be disposed around the components 14 and the intermediate carriers 112. The molding process can be assisted by an encapsulant vacuum assist 165 that applies a vacuum and draws the encapsulant 130 through the mold and across the components 14 and the intermediate carriers 112.

Figure 7B:
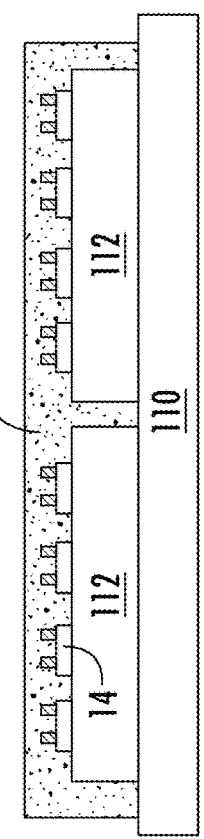

FIG. 7B, continuing from FIG. 7A, illustrates a cross-sectional side view of the reconstituted panel 134 removed from the mold 160.

FIG. 7C illustrates another cross-sectional side view of encapsulating intermediate carriers 112 using a suitable process, such as molding, similar to what was illustrated in FIG. 7A. FIG. 7C provides the additional detail of a mold release film 170 being disposed within the mold 160, such as along upper and lower surface of the top mold 161 and the bottom mold 162, respectively, as part of a film-assisted molding process. The mold release film 170 comprises film, such as Teflon film or any other suitable substance that provides a bond break between the encapsulant 130 and the mold 160 to allow for easier removal of the reconstituted panel 134 from the mold 160. FIG. 7C also differs from FIG. 7A by omitting injection port 164 and encapsulant vacuum assist 165 from the drawing for simplicity; however, the POSA will appreciate that these may still be used. Further, FIG. 7C shows the mold release film 170 moving from a new roll 171 on the left of the mold 160 to a used roll 172 on the right of the mold 160, which while omitted from FIG. 7A for simplicity, can also be present in practice.

FIG. 7C also differs from FIG. 7A by showing an embodiment in which the intermediate carriers 112 may be disposed within the mold 160 and encapsulated with encapsulant 130 without the temporary carrier 110 being present. When the temporary carrier 110 is not present, cost may be reduced and efficiency improved. In the absence of the temporary carrier 110 (which can provide stability during the molding process) additional stability for the intermediate carriers 112 can be provided during the molding process through an IMC vacuum assist 166, which can provide a force, vacuum, or suction, such as through openings 174 in mold release tape 170.

FIG. 7D illustrates a plan view or top view of intermediate carriers 112 disposed within the mold 160 and over (or on) the mold release tape 170. Further, openings 174 formed through the mold release tape 170 and used for the IMC vacuum assist 166, are shown being positioned within footprints 176 of the intermediate carriers 112. The openings 174 may be formed while the mold release tape 170 is within the mold 160, or alternatively, the openings 174 may be formed outside of the mold 160 before the mold release tape 170 is disposed within the mold 160. The openings 174 may be formed mechanically, such as with a punch or other suitable device, thermally, such as with a laser or another suitable heat source, and may also be formed chemically or in any other suitable or desirable way that is conducive to forming the openings 174 within or without of the mold 160.

FIG. 7E illustrates a cross-sectional side view of the reconstituted panel 134 removed from the mold 160 without temporary carrier 110 after the molding process, such as with mold release tape 170 and IMC vacuum assist 166.

In another embodiment similar to that shown in FIG. 7C, intermediate carriers 112 could have recesses in their bottom surface that correspond to pins formed in the bottom mold 162. The recesses in the intermediate carriers 112 could fit over the pins in the bottom mold 162 to both align the carriers and hold them in place during the molding process. In this embodiment there may not be a need for a vacuum hold-down of the intermediate carriers 112 during molding. If a film 170 is used in this embodiment it may not need to have vacuum holes formed in it. Optionally no film may be used on the bottom mold 162 and instead a suitable mold release material may be periodically applied to the lower mold 162 to allow the reconstituted panel 134 to easily release from the mold bottom 162 after the molding process is completed.

The method of making a fan-out or fan-in semiconductor assembly with an intermediate carrier, as described herein, provides a number of advantages over what has been known in the prior art. For example, the equipment that is normally used for placing components on a temporary carrier 110 normally used for fan out wafer level packaging (FOWLP) runs relatively slowly when picking and placing very small components. The method described herein improves the speed of mounting very small components, since equipment that is very fast at picking and placing very small components can be used to populate a smaller intermediate carrier 112, and then the intermediate carriers 112 that are populated with components 14 can be placed on a conventional, temporary carrier 110 for use through the next process steps. In this way, the speed of placing very small components is enhanced due to the shorter travel distances of the pick and place mechanism and commensurately the cost of the die attach operation is reduced. Also, since in many instances the intermediate carrier 112 will be removed before the assembly 150 is completed, then the attachment material 50 or die attach paste 51 used to attach the components 14 to the intermediate carrier 112 (embodiments as depicted in FIGS. 3A and 3B) can be a standard, low-cost adhesive, tape, or paste and not a specially formulated thermal or UV release tape that is much more expensive. In some cases, the intermediate carrier 112 can be a metal element that stays with the final package assembly 150, and can provide thermal dissipation benefits and possibly electrical benefits-such as backside grounding for the component. Additionally, a reconstituted panel 134 may be formed by disposing a single type of an encapsulant 130 in single step over the plurality of components 14 mounted to the one or more intermediate carriers 112 at a same time. The fan-out build-up interconnect structure 154 may be formed at a same location over the reconstituted panel 134 with the components 14 being mounted to the intermediate carriers 112, and the intermediate carriers 112 mounted to the temporary carrier 110. In some instances, the encapsulant 130 or mold compound, the warpage compensation material 54, or both, may be cured (including a second or b-stage cure) at a same time. In other instances, the encapsulant 130 or mold compound may be cured first, before any other material is applied, and subsequently placed materials are later cured.

After formation of the planar surface 132 as shown in FIG. 3L, a metal removal or etching process may reduce a height, $H_1$, (as shown in FIG. 1B) of the conductive studs 125 (and create a recess 128a with respect to the planar surface 132) the recess 128a having a distance in a range of 50-1,000 nm. Further, by coupling the plurality of components 14 to intermediate carriers 112 and then to a temporary carrier 110, wafer fabrication of the fan-out build-up interconnect structure 154 may be made for each of the plurality of components 14 with no wirebonding and without separate molding or encapsulating at a level of the intermediate carrier 112 (or strip), but the processing for the fan-out build-up interconnect structure 154 happens for a temporary carrier 110. In other words, the methods allow fan-out wafer format packaging to occur at panel level (and for larger reconstituted panels 134) rather than at a strip or intermediate carrier 112 level, resulting in much higher throughput and enhanced productivity.

Some aspects of the disclosure concern methods of making a semiconductor assembly 150, comprising: providing a plurality of components 14; providing a one or more intermediate carriers 112; mounting the plurality of components 14 to the one or more intermediate carriers 112; providing a temporary carrier 110; mounting the one or more intermediate carriers 112 to the temporary carrier 110, wherein the one or more intermediate carriers 112 comprise the plurality of components 14 mounted to the one or more intermediate carriers 112; and disposing an encapsulant 130 over the plurality of components 14 mounted to the temporary carrier 110 so as to form a reconstituted panel 134, wherein the encapsulant 130 is disposed around four side surfaces of each of the plurality of components 114.

Some embodiments further comprise forming the plurality of components 14 with contact pads 22 and without conductive studs 125. Some embodiments comprise mounting the plurality of components 14 face-up on the intermediate carrier 112. Still other embodiments comprise mounting the plurality of components 14 face-down over the larger carrier 110 while the plurality of components 14 are coupled to the one or more intermediate carriers 112. The one or more intermediate carriers 112 may be removed from the back sides 18 of the plurality of components 14 before encapsulating the plurality of components 14 to form the reconstituted wafer 134.

Some methods further comprise coupling the plurality of components 14 to the one or more intermediate carriers 112 with a first release layer 52a; and coupling the one or more intermediate carriers 112 to the temporary carrier 110 with a second release layer 52b. Some methods further comprise coupling the one or more intermediate carriers 112 with a first adhesive or tape 52a layer that is not a release layer; and coupling the one or more intermediate carriers 112 to the temporary carrier 110 with a release layer 52.

The first release layer 52a and the second release layer 52b comprise one or more of a thermal release layer and a UV release layer with a translucent carrier. In some embodiments, the method further comprises providing the first release layer 52a as a first thermal release layer that releases at a first temperature and providing the second release layer 52b as second thermal release layer that releases at a second temperature that is greater than the first temperature.

Some methods further comprise removing the one or more intermediate carriers 112 from the plurality of components 14 before encapsulating the plurality of components 14.

Certain methods further comprise disposing the encapsulant 130 by placing and pressing the encapsulant around the plurality of components in a so-called compression molding process, which may or may not comprise a vacuum.

Some methods further comprise providing a lower viscosity encapsulant 130; disposing the encapsulant 130 around the plurality of components 14 and around the intermediate carrier 112 using a mold or molding process.

While this disclosure includes a number of embodiments in different forms, there is presented in the drawings and written descriptions in the following pages detail of particular embodiments with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the disclosure as set forth in the appended claims. The specification and drawings are, accordingly, to be regarded in an illustrative sense rather than a restrictive sense.

What is claimed is:

1. A method of making a plurality of semiconductor assemblies, comprising:
   providing a plurality of components comprising conductive studs disposed over a front surface of the plurality of components, wherein the plurality of components ($C_1$), comprise a thickness in a range of 2-500 micrometers (μm);
   providing one or more intermediate carriers, wherein the one or more intermediate carriers are not interposers and do not comprise electrical routing in or on the one or more intermediate carriers;
   mounting the plurality of components face up to the one or more intermediate carriers such that an active layer of the plurality of components is oriented away from the one or more intermediate carriers;
   providing a temporary carrier;
   mounting the one or more intermediate carriers to the temporary carrier, wherein the one or more intermediate carriers comprise the plurality of components mounted face up to the one or more intermediate carriers;

disposing an encapsulant over the one or more intermediate carriers and over the plurality of components mounted face up to the one or more intermediate carriers after the intermediate carriers are mounted to the temporary carrier so as to form a reconstituted panel, wherein the encapsulant is disposed around four side surfaces of each of the plurality of components, over the front surface of each of the plurality of components, and contacting at least a portion of the sides of the conductive studs; and removing a portion of the encapsulant to form a substantially planar surface above the front surface of the plurality of components, wherein the substantially planar surface comprises ends of the conductive studs and a planar surface of the encapsulant.

2. The method of claim 1, wherein the plurality of components comprises one or more of: an active device, a passive device, an IPD, a MEMS device, a sensor, a semiconductor chip, a transistor, a diode, a chiplet, an LED, a VCSEL, an RF device, a microwave device, a photonic device, and a bridge die, which comprise a footprint with edge lengths in a range of 0.15-25 millimeters (mm).

3. The method of claim 1, wherein the one or more intermediate carriers comprises one or more of a core, a copper-clad laminate, a sheet of woven glass fiber impregnated with epoxy, FR4, Composite Epoxy Material (CEM), a printed circuit board (PCB) core, plastic, mold compound, a PCB with routing, glass, metal, ceramic, silicon, fiberboard, a laminate of paper and epoxy or phenolic resin, and polymer.

4. The method of claim 1, wherein the thickness ($T_1$) of the plurality of components is within a range of 2-125 µm.

5. The method of claim 1, further comprising removing the temporary carrier after disposing an encapsulant over the one or more intermediate carriers; and applying a warpage compensation material to a backside of the intermediate carriers after removing the temporary carrier from the reconstituted panel comprising intermediate carriers.

6. The method of claim 1, further comprising forming a fan-in or fan-out build-up interconnect structure over the substantially planar surface above each of the plurality of components.

7. The method of claim 1, further comprising:

removing the temporary carrier after disposing an encapsulant over the one or more intermediate carriers; and removing the intermediate carriers and at least a portion of the encapsulant through a thinning process to thin the reconstituted panel and expose backsides of the plurality of components.

8. The method of claim 1, further comprising:

disposing the encapsulant such that it covers four side surfaces of intermediate carriers; and leaving at least a portion of the intermediate carriers within the plurality of semiconductor assemblies.

9. The method of claim 1, wherein the one or more intermediate carriers comprises a conductive material that provides electrical conductivity, thermal conductivity, or both, to backsides of one or more of the plurality of components.

10. A method of making a semiconductor assembly, comprising:

providing a plurality of components;

providing one or more intermediate carriers, wherein the one or more intermediate carriers are not interposers and do not comprise electrical routing in or on the one or more intermediate carriers:

mounting the plurality of components to the one or more intermediate carriers;

providing a temporary carrier;

mounting the one or more intermediate carriers to the temporary carrier, wherein the one or more intermediate carriers comprise the plurality of components already mounted to the one or more intermediate carriers; and disposing an encapsulant over the one or more intermediate carriers and over the plurality of components mounted to the temporary carrier to form a reconstituted panel, wherein the encapsulant is disposed around four side surfaces of each of the plurality of components.

11. The method of claim 10, further comprising forming the plurality of components with contact pads disposed on a front surface of the plurality of components and without conductive studs.

12. The method of claim 11, further comprising:

coupling the plurality of components to the one or more intermediate carriers with a first release layer; and coupling the intermediate carriers to the temporary carrier with a second release layer, wherein the first release layer and the second release layer comprise one or more of: a UV release layer with a UV transparent carrier, a thermal release layer, and a first thermal release layer that releases at a first temperature, and a second thermal release layer that releases at a second temperature that is greater than the first temperature.

13. The method of claim 11, further comprising disposing the plurality of components face-up over the intermediate carrier and over the temporary carrier.

14. The method of claim 11, further comprising disposing the encapsulant such that it covers four side surfaces of intermediate carriers.

15. The method of claim 10, further comprising providing the plurality of components comprising conductive studs disposed over a front surface of the plurality of components.

16. The method of claim 15, further comprising removing a portion of the encapsulant to form a substantially planar surface above the front surface of the plurality of components, wherein the substantially planar surface comprises ends of the conductive studs and a planar surface of the encapsulant.

17. The method of claim 10, wherein the plurality of components comprises one or more of: an active device, a passive device, an IPD, a MEMS device, a sensor, a semiconductor chip, a transistor, a diode, a chiplet, an LED, a VCSEL, an RF device, a microwave device, a photonic device, and a bridge die.

18. The method of claim 10, wherein each component of the plurality of components comprises a footprint with edge lengths in a range of 0.15-25 millimeters (mm) and a thickness, ($T_1$), in a range of 2-780 micrometers (µm).

19. The method of claim 10, further comprising forming a fan-in or fan-out build-up interconnect structure over each of the plurality of components that extends beyond an edge of each of the plurality of components.

20. The method of claim 10, further comprising:
removing the temporary carrier after disposing an encapsulant material over the one or more intermediate carriers; and
removing portion of the encapsulant through a thinning process to thin the reconstituted panel and to remove at least a portion of the intermediate carriers.

21. The method of claim 10, wherein the intermediate carriers comprise at least one of a component pad or at least a portion of a thermal frame.

* * * * *